(12) United States Patent
Sugihara et al.

(10) Patent No.: US 9,694,572 B2
(45) Date of Patent: Jul. 4, 2017

(54) BONDING DEVICE AND BONDING SYSTEM

(71) Applicant: TOKYO ELECTRON LIMITED, Tokyo (JP)

(72) Inventors: Shintaro Sugihara, Koshi (JP); Hajime Furuya, Koshi (JP); Goro Furutani, Koshi (JP); Yasunobu Iwamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 140 days.

(21) Appl. No.: 14/532,294

(22) Filed: Nov. 4, 2014

(65) Prior Publication Data

US 2015/0129137 A1 May 14, 2015

(30) Foreign Application Priority Data

Nov. 13, 2013 (JP) ................... 2013-234793

(51) Int. Cl.
*B32B 38/10* (2006.01)
*B32B 38/18* (2006.01)
(Continued)

(52) U.S. Cl.
CPC .... *B32B 38/1858* (2013.01); *H01L 21/67092* (2013.01); *H01L 21/681* (2013.01);
(Continued)

(58) Field of Classification Search
CPC .... B32B 2038/0056; B32B 2038/1891; B32B 2309/10; B32B 2457/14; B32B 37/10;
(Continued)

(56) References Cited

U.S. PATENT DOCUMENTS 5,842,690 A * 12/1998 Lee ................... H01L 21/68721
269/21
5,848,868 A * 12/1998 Suzuki .............. H01L 21/67778
356/399

(Continued)

FOREIGN PATENT DOCUMENTS

JP 2004-207436 * 7/2004
JP 2012-175043 A 9/2012

OTHER PUBLICATIONS

Drawings of JP 2012-175043.*
English translation of JP2004-207431.*

*Primary Examiner* — George Koch
(74) *Attorney, Agent, or Firm* — Nath, Goldberg & Meyer; Jerald L. Meyer

(57) ABSTRACT

Provided is a device of bonding substrates together, which includes a first holding unit configured to vacuum-draw a first substrate and to adsorptively hold the first substrate on a lower surface thereof and a second holding unit installed below the first holding unit and configured to vacuum-draw a second substrate and to adsorptively hold the second substrate on an upper surface thereof. The second holding unit includes: a body portion configured to vacuum-draw the entire surface of the second substrate; a plurality of pins installed on the body portion and configured to make contact with a rear surface of the second substrate; and a support portion installed on the body portion at the outer side of the pins, the support portion having a reduced contact area over which the support portion makes contact with an outer peripheral portion of the second substrate.

9 Claims, 22 Drawing Sheets

(51) Int. Cl.
*H01L 21/67* (2006.01)
*H01L 21/68* (2006.01)
*H01L 21/687* (2006.01)
*B32B 38/00* (2006.01)
*B32B 37/10* (2006.01)

(52) U.S. Cl.
CPC .......... *H01L 21/6875* (2013.01); *B32B 37/10* (2013.01); *B32B 2038/0056* (2013.01); *B32B 2038/1891* (2013.01); *B32B 2309/10* (2013.01); *B32B 2457/14* (2013.01); *Y10T 156/1744* (2015.01)

(58) Field of Classification Search
CPC .......... B32B 38/1858; H01L 21/67092; H01L 21/681; H01L 21/6875; Y10T 156/1744
USPC .................................................. 438/118, 455
See application file for complete search history.

(56) References Cited

U.S. PATENT DOCUMENTS

| | | | |
|---|---|---|---|
| 8,846,495 B2* | 9/2014 | Deguchi | H01L 21/67121 257/300 |
| 2002/0036373 A1* | 3/2002 | Kosakai | B25B 11/005 269/21 |
| 2003/0079829 A1* | 5/2003 | Ueyama | B32B 38/10 156/230 |
| 2005/0000634 A1* | 1/2005 | Craig | G06K 19/07718 156/230 |
| 2010/0206454 A1* | 8/2010 | Maeda | H01L 21/67092 156/60 |
| 2012/0006489 A1* | 1/2012 | Okita | H01L 21/67757 156/345.43 |
| 2012/0044609 A1* | 2/2012 | Cooke | H01L 21/6875 361/234 |
| 2013/0195587 A1* | 8/2013 | Hosaka | H01L 21/6773 414/222.13 |

* cited by examiner

BONDING DEVICE AND BONDING SYSTEM

CROSS-REFERENCE TO RELATED APPLICATION

This application claims the benefit of Japanese Patent Application No. 2013-234793, filed on Nov. 13, 2013, in the Japan Patent Office, the disclosure of which is incorporated herein in its entirety by reference.

TECHNICAL FIELD

The present disclosure relates to a bonding device used to bond substrates together and a bonding system provided with the bonding device.

BACKGROUND

In recent years, semiconductor devices have been under high integration. When many highly-integrated semiconductor devices are arranged in a horizontal plane and are connected by wirings for final fabrication, there are problems due to the increase in wiring length, wiring resistance and wiring delay.

Under the circumstances, a three-dimensional integration technique for stacking semiconductor devices in three dimensions has been proposed. This three-dimensional integration technique uses a bonding system to bond two semiconductor wafers (hereinafter abbreviated as "wafers") together. For example, the bonding system includes a surface modifying device (surface activating device) for modifying bonding surfaces of the wafers, a surface hydrophilizing device for hydrophilizing the surfaces of the wafers modified by the surface modifying device and a bonding device for bonding the wafers having the surfaces hydrophilized by the surface hydrophilizing device. In this bonding system, the surface modifying device modifies the surfaces of the wafers by plasma-processing, and the surface hydrophilizing device hydrophilizes the surfaces of the wafers by supplying pure water onto the surfaces. Thereafter, the two wafers are disposed in the bonding device so as to vertically face each other (hereinafter, the wafer existing at the upper side will be referred to as an "upper wafer" and the wafer existing at the lower side will be referred to as a "lower wafer"). The upper wafer is held by an upper chuck and the lower wafer is held by a lower chuck. These wafers are bonded to each other by a Van der Waals force and hydrogen bonding (an inter-molecular force).

The lower chuck has, e.g., a flat plate shape, and adsorptively holds the lower wafer on the entire upper surface thereof. However, there may be, e.g., a case where particles adhere to a rear surface of the lower wafer thus held, or a case where particles exist on a front surface of the lower chuck. As such, the front surface of the lower chuck becomes uneven (has a large flatness). In this case, such a flatness of the lower chuck is transferred to the lower wafer. This causes vertical distortion in a bonded overlapped wafer which is obtained by bonding the lower wafer and the upper wafer together.

In addition, if the front surface of the lower chuck is not flat, there may be a location where a distance between the upper surface and the lower wafer bonded together is short. In this location, when the upper wafer and the lower wafer make contact with each other, it is impossible to completely discharge air existing between the upper wafer and the lower wafer. This causes a void in the bonded overlapped wafer. Accordingly, there is room for improvement in the bonding process of the wafers.

As a result of the earnest research conducted by the present inventors, it was found that the existence of particles in an outer peripheral portion of a front surface of a second holding unit (used as the lower chuck) is a major culprit in generating a vertical distortion (a distortion exceeding a tolerance) in an overlapped substrate obtained by bonding a first substrate (or first wafer) and a second substrate (or second wafer). The present inventors found that the vertical distortion of the overlapped substrate is suppressed by making the contact area of the second holding unit with the outer peripheral portion of the second substrate small.

SUMMARY

Some embodiments of the present disclosure provide a bonding device and a bonding system capable of appropriately holding substrates when the substrates are bonded together and capable of appropriately performing a bonding process of the substrates.

According to one embodiment of the present disclosure, provided is a device of bonding substrates together, which includes: a first holding unit configured to vacuum-draw a first substrate and to adsorptively hold the first substrate on a lower surface thereof; and a second holding unit installed below the first holding unit and configured to vacuum-draw a second substrate and to adsorptively hold the second substrate on an upper surface thereof. The second holding unit includes: a body portion configured to vacuum-draw the entire surface of the second substrate; a plurality of pins installed on the body portion and configured to make contact with a rear surface of the second substrate; and a support portion installed on the body portion at the outer side of the pins, the support portion having a reduced contact area over which the support portion makes contact with an outer peripheral portion of the second substrate so as to support an outer peripheral portion of the rear surface of the second substrate when the second holding unit vacuum-draws the outer peripheral portion of the second substrate.

According to another embodiment of the present disclosure, provided is a bonding system provided with the aforementioned bonding device, which includes: a processing station including the bonding device; and a carry-in/carry-out station capable of holding a plurality of first substrates, a plurality of second substrates or a plurality of overlapped substrates each of which obtained by bonding the first substrate and the second substrate and configured to carry the first substrate, the second substrate or the overlapped substrate into and out of the processing station. The processing station includes: a surface modifying device configured to modify a front surface of the first substrate or the second substrate to be bonded; a surface hydrophilizing device configured to hydrophilize the front surface of the first substrate or the second substrate modified in the surface modifying device; and a transfer device configured to transfer the first substrate, the second substrate or the overlapped surface between the surface modifying device, the surface hydrophilizing device and the bonding device, wherein the bonding device is configured to bond the first substrate and the second substrate whose front surfaces are hydrophilized by the surface hydrophilizing device.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to a bonding device and a bonding system of various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
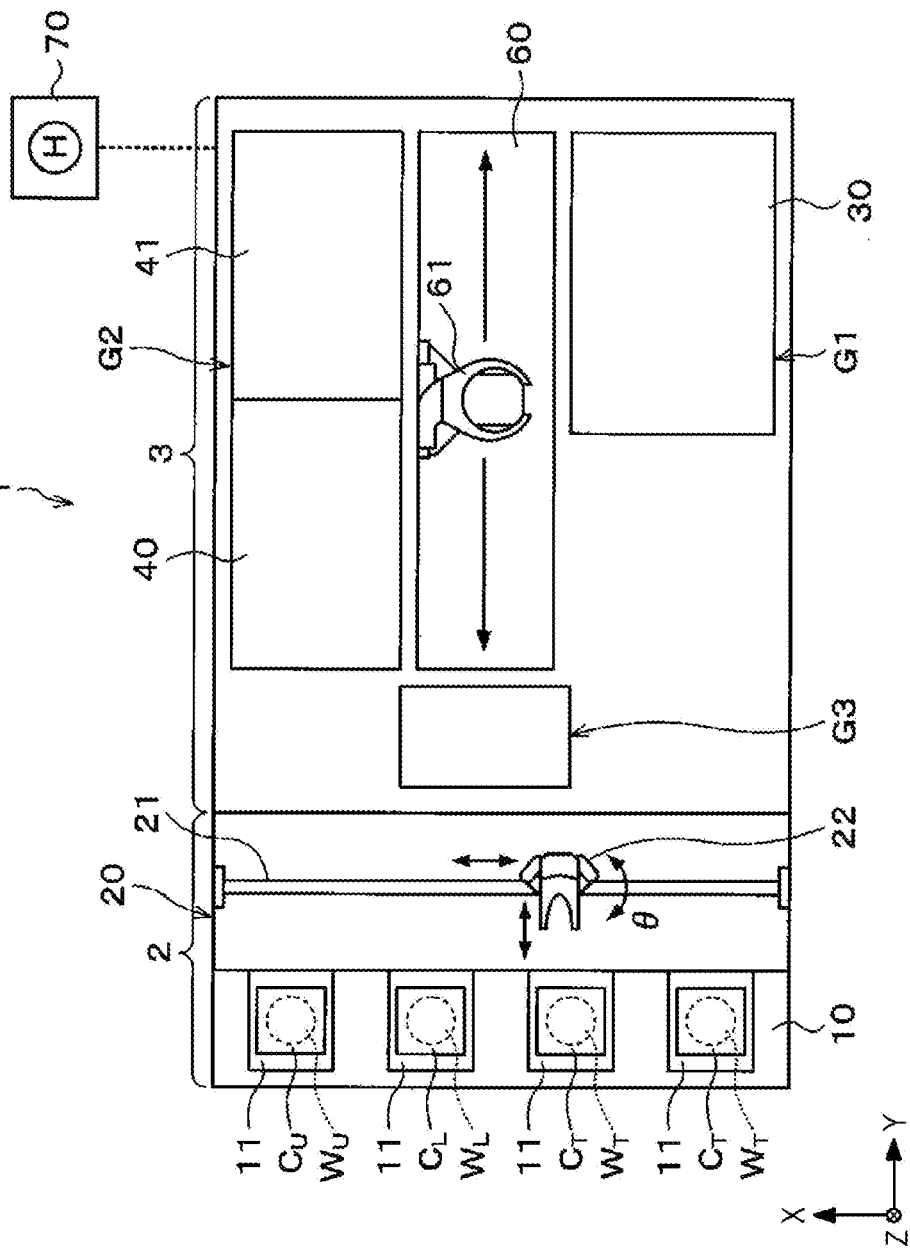
FIG. 1 is a plan view schematically showing a configuration of a bonding system according to one embodiment of the present disclosure.
Figure 2:
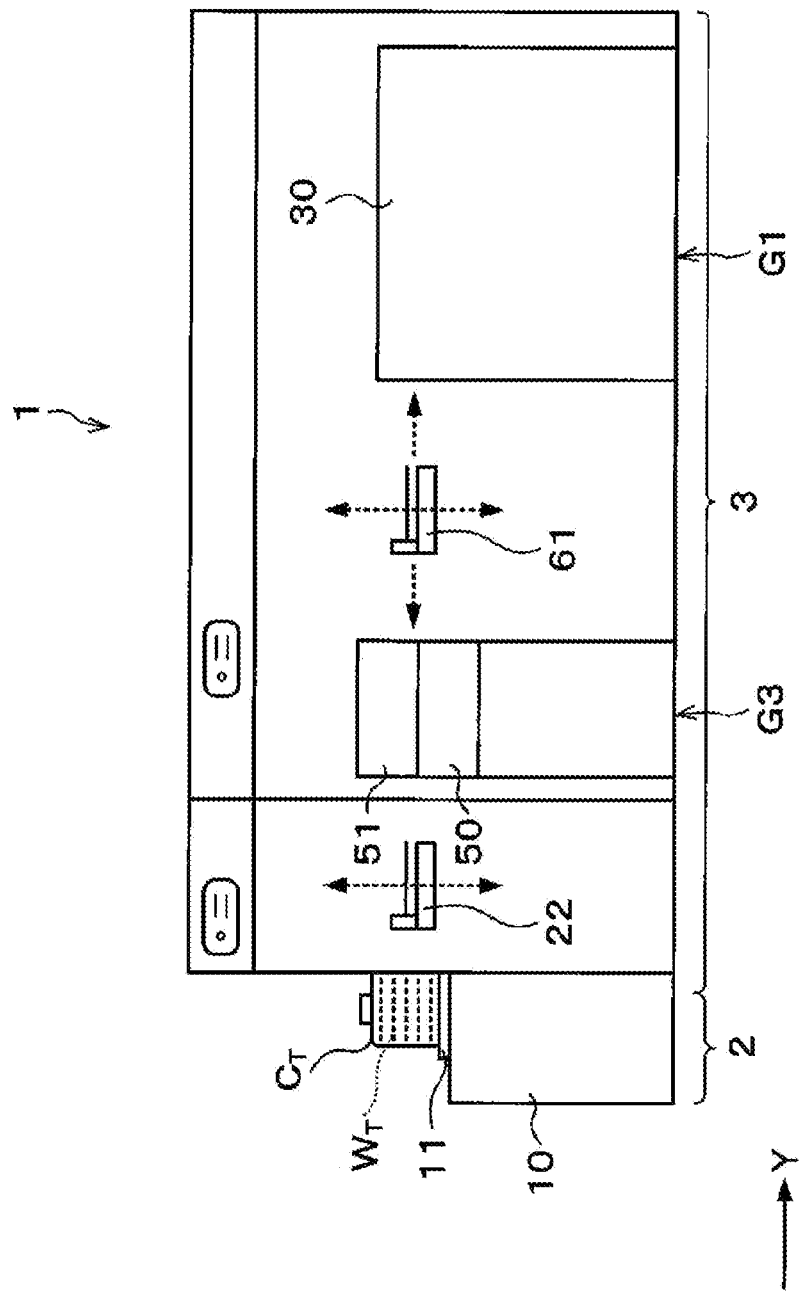
FIG. 2 is a side view schematically showing an internal configuration of the bonding system according to one embodiment of the present disclosure.

FIG. 1 is a plan view schematically showing a configuration of a bonding system 1 according to one embodiment of the present disclosure. FIG. 2 is a side view schematically showing an internal configuration of the bonding system 1.

Figure 3:
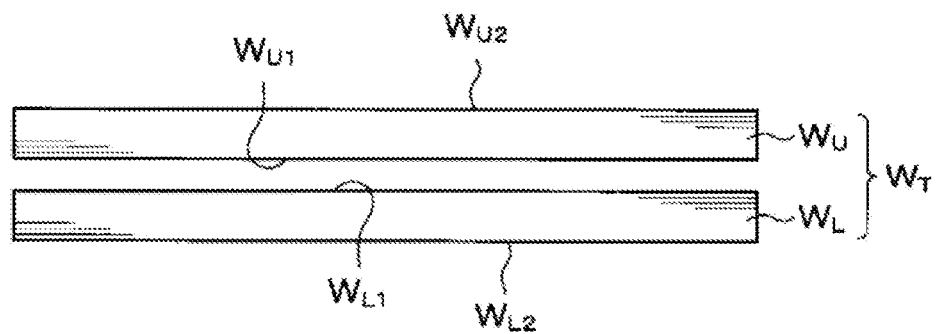
FIG. 3 is a side view schematically showing configurations of an upper wafer and a lower wafer.

The bonding system 1 is used to bond two substrates, for example, wafers $W_U$ and $W_L$, together, as shown in FIG. 3. In the following description, a wafer arranged at the upper side is referred to as an "upper wafer $W_U$," which serves as a first substrate, and a wafer arranged at the lower side is referred to as a "lower wafer $W_L$" which serves as a second substrate. Moreover, a bonding surface of the upper wafer $W_U$ bonded to the lower wafer $W_L$ is referred to as a "front surface $W_{U1}$," whereas a surface opposite to the front surface $W_{U1}$ is referred to as a "rear surface $W_{U2}$." Similarly, a bonding surface of the lower wafer $W_L$ bonded to the upper wafer $W_U$ is referred to as a "front surface $W_{L1}$," whereas a surface opposite to the front surface $W_{L1}$ is referred to as a "rear surface $W_{L2}$." In addition, in the bonding system 1, an overlapped wafer $W_T$ serving as an overlapped substrate is formed by bonding the upper wafer $W_U$ and the lower wafer $W_L$.

As shown in FIG. 1, the bonding system 1 includes a carry-in/carry-out station 2 and a processing station 3 which are integratedly connected to each other. Cassettes $C_U$, $C_L$, and $C_T$ respectively capable of accommodating a plurality of upper wafers $W_U$, a plurality of lower wafers $W_L$ and a plurality of overlapped wafers $W_T$ are carried into and out of the carry-in/carry-out station 2. The processing station 3 is provided with various types of processing devices which implement predetermined processes with respect to the upper wafers $W_U$, the lower wafers $W_L$ and the overlapped wafers $W_T$.

A cassette mounting table 10 is installed in the carry-in/carry-out station 2. A plurality of, e.g., four, cassette mounting boards 11 are installed in the cassette mounting table 10. The cassette mounting boards 11 are arranged in a line along a horizontal X-direction (an up-down direction in FIG. 1). The cassettes $C_U$, $C_L$ and $C_T$ can be mounted on the cassette mounting boards 11 when carrying the cassettes $C_U$, $C_L$ and $C_T$ into and out of the bonding system 1. In this way, the carry-in/carry-out station 2 is configured to hold the upper wafers $W_U$, the lower wafers $W_L$ and the overlapped wafers $W_T$. The number of the cassette mounting boards 11 is not limited to this embodiment but may be arbitrarily determined One of the cassettes may be used as a collection cassette for collecting defective wafers. That is to say, the collection cassette is a cassette by which the defective wafers each having a defect caused by various factors when bonding the upper wafer $W_U$ and the lower wafer $W_L$ can be separated from other normal overlapped wafers $W_T$. In this embodiment, one of the cassettes $C_T$ is used as the collection cassette for collecting the defective wafers, and the other is used to accommodate the normal overlapped wafers $W_T$.

In the carry-in/carry-out station 2, a wafer transfer part 20 is installed adjacent to the cassette mounting table 10. A wafer transfer device 22 movable along a transfer path 21 extending in the X-direction is installed in the wafer transfer part 20. The wafer transfer device 22 is movable in a vertical direction and about a vertical axis (in a 0 direction). The wafer transfer device 22 is configured to transfer the upper wafer $W_U$, the lower wafer $W_L$ and the overlapped wafer $W_T$ between the cassettes $C_U$, $C_L$ and $C_T$ mounted on the respective cassette mounting boards 11 and the below-mentioned transition devices 50 and 51 of a third processing block G3 of the processing station 3.

A plurality of, e.g., three, processing blocks G1, G2 and G3 provided with various types of devices is installed in the processing station 3. For example, the first processing block G1 is installed at the front side of the processing station 3 (from the negative X-direction in FIG. 1). The second processing block G2 is installed at the back side of the processing station 3 (from the positive X-direction in FIG. 1). The third processing block G3 is installed at the side of the carry-in/carry-out station 2 in the processing station 3 (from a negative Y-direction in FIG. 1).

For example, a surface modifying device 30 configured to modify the front surfaces $W_{U1}$ and $W_{L1}$ of the upper and lower wafers $W_U$ and $W_L$ is arranged in the first processing block G1. In the surface modifying device 30, an oxygen gas and a nitrogen gas used as process gases are excited, converted to plasma and ionized under, e.g., a depressurized atmosphere. The oxygen and nitrogen ions are irradiated on the front surfaces $W_{U1}$ and $W_{L1}$, whereby the front surfaces $W_{U1}$ and $W_{L1}$ are plasma-processed and modified.

The second processing block G2 includes, for example, a surface hydrophilizing device 40 and a bonding device 41, which are arranged side by side in the named order from the side of the carry-in/carry-out station 2 along the horizontal Y-direction. The surface hydrophilizing device 40 is configured to hydrophilize and clean the front surfaces $W_{U1}$ and $W_{L1}$ of the upper and lower wafers $W_U$ and $W_L$ using, e.g., pure water. The bonding device 41 is configured to bond the upper and lower wafers $W_U$ and $W_L$.

The surface hydrophilizing device 40 supplies the pure water onto the upper and lower wafers $W_U$ and $W_L$ while rotating the upper and lower wafers $W_U$ and $W_L$ held by, e.g., a spin chuck. The supplied pure water is diffused on the front surfaces $W_{U1}$ and $W_{L1}$ of the upper and lower wafers $W_U$ and $W_L$, whereby the front surfaces $W_{U1}$ and $W_{L1}$ are hydrophilized. The configuration of the bonding device 41 will be described later.

For example, in the third processing block G3, the transition devices 50 and 51 for the upper and lower wafers $W_U$ and $W_L$ and the overlapped wafers $W_T$ are installed in two stages one above another from below as shown in FIG. 2.

As shown in FIG. 1, a wafer transfer region 60 is formed in an area surrounded by the first processing block G1, the second processing block G2 and the third processing block G3. For example, a wafer transfer device 61 is arranged in the wafer transfer region 60.

The wafer transfer device 61 includes a transfer arm which is movable in, e.g., the vertical direction (the Z-direction), the horizontal directions (the Y-direction and the X-direction) and rotatable about the vertical axis. The wafer transfer device 61 is configured to move within the wafer transfer region 60 and transfer the upper and lower wafers $W_U$ and $W_L$ and the overlapped wafer $W_T$ to a specified device existing within the first processing block G1, the second processing block G2 or the third processing block G3 disposed around the wafer transfer region 60.

As shown in FIG. 1, a control unit 70 is installed in the bonding system 1 as described above. The control unit 70 is, e.g., a computer, and is provided with a program storage unit (not shown). The program storage unit stores a program that controls the processing of the upper and lower wafers $W_U$ and $W_L$ and the overlapped wafer $W_T$ performed in the bonding system 1. Furthermore, the program storage unit stores a program for controlling the operations of drive systems for various types of processing devices and the transfer devices described above to realize the below-mentioned wafer bonding process in the bonding system 1. The aforementioned programs may be recorded in a computer-readable storage medium H such as, e.g., a hard disc (HD), a flexible disc (FD), a compact disc (CD), a magneto-optical disc (MO) or a memory card, and installed in the control unit 70 from the storage medium H.

Figure 4:
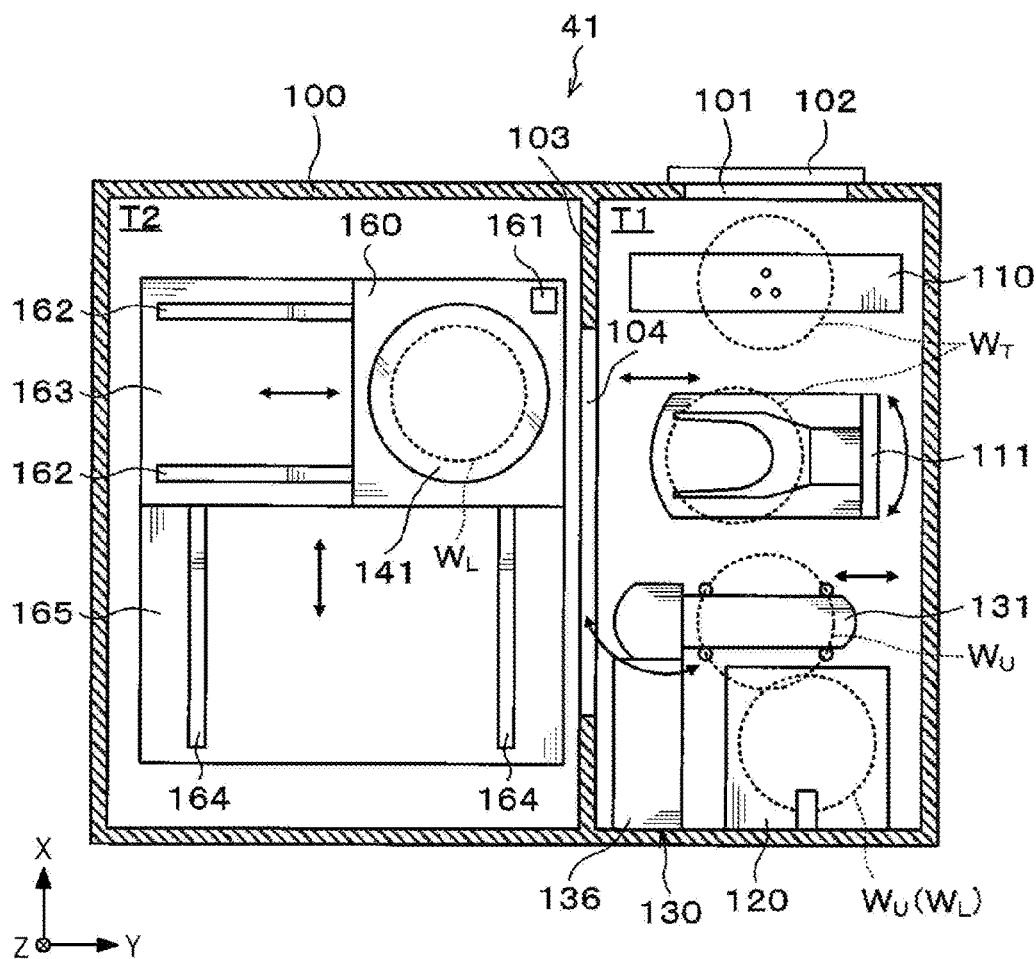
FIG. 4 is a horizontal sectional view schematically showing a configuration of a bonding device.

Next, description will be made on the configuration of the bonding device 41. As shown in FIG. 4, the bonding device 41 includes a processing vessel 100, the interior of which is hermetically sealable. A carry-in/carry-out gate 101 through which the upper and lower wafers $W_U$ and $W_L$ and the overlapped wafer $W_T$ are carried is formed on a side surface adjoining the wafer transfer region 60 in the processing vessel 100. An opening/closing shutter 102 is installed in the carry-in/carry-out gate 101.

The interior of the processing vessel 100 is divided into a transfer region T1 and a processing region T2 by an internal wall 103. The carry-in/carry-out gate 101 is formed on the side surface of the processing vessel 100 corresponding to the transfer region T1. A carry-in/carry-out gate 104 through which the upper and lower wafers $W_U$ and $W_L$ and the overlapped wafer $W_T$ are carried is also formed in the internal wall 103.

In the transfer region T1, a transition 110 is located at the forward side of the X-direction to temporarily mount the upper and lower wafers $W_U$ and $W_L$ and the overlapped wafer $W_T$ thereon. The transitions 110 is installed in, e.g., two stages, and are capable of simultaneously mounting two of the upper and lower wafers $W_U$ and $W_L$ and the overlapped wafer $W_T$.

Figure 5:
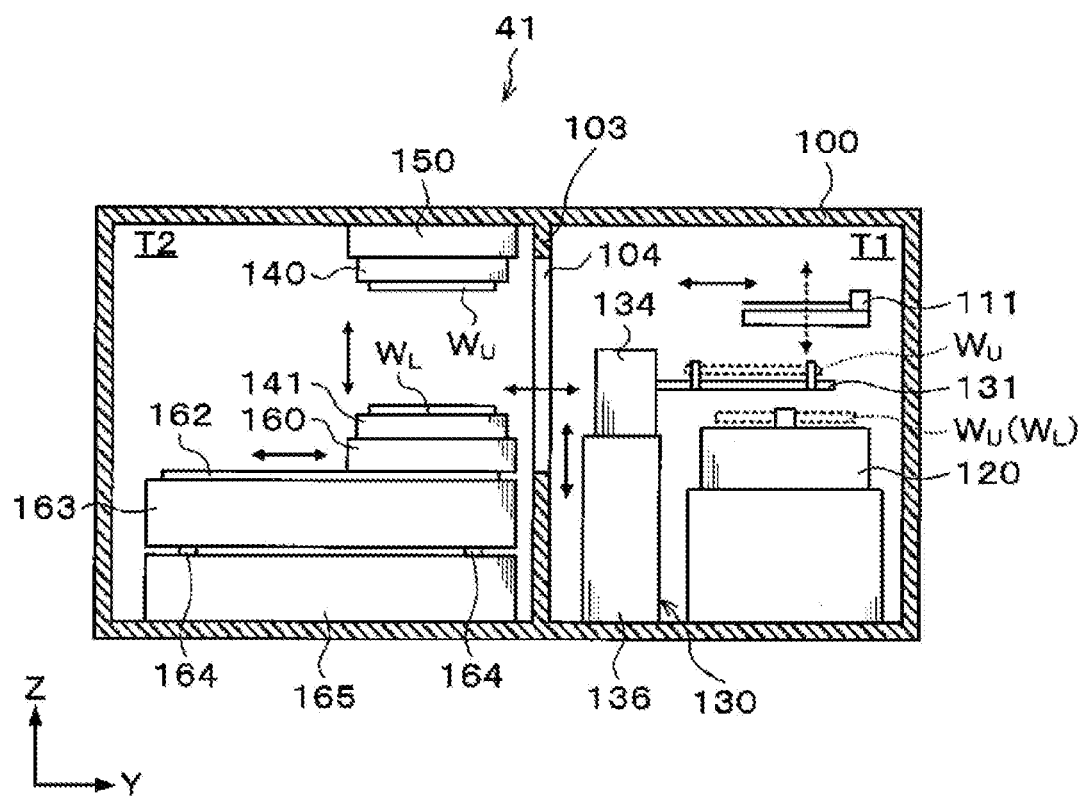
FIG. 5 is a vertical sectional view schematically showing the configuration of a bonding device.

A wafer transfer mechanism 111 is installed in the transfer region T1. As shown in FIGS. 4 and 5, the wafer transfer mechanism 111 includes a transfer arm which is movable in, e.g., the vertical direction (the Z-direction), the horizontal directions (the Y-direction and the X-direction) and rotatable about the vertical axis. The wafer transfer mechanism 111 is configured to transfer the upper and lower wafers $W_U$ and $W_L$ and the overlapped wafer $W_T$ within the transfer region T1 or between the transfer region T1 and the processing region T2.

Figure 6:
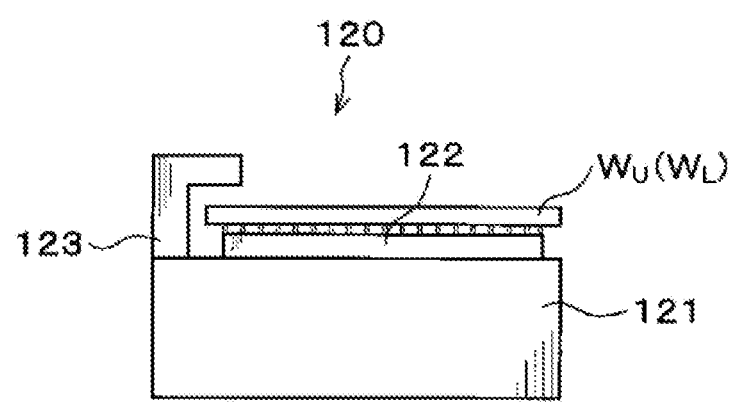
FIG. 6 is a side view schematically showing a configuration of a position adjustment mechanism.

A position adjustment mechanism 120, which is configured to adjust an orientation of the horizontal direction of each of the upper and lower wafers $W_U$ and $W_L$, is located in the backward side of the X-direction in the transfer region T1. As shown in FIG. 6, the position adjustment mechanism 120 includes a base 121, a holding unit 122 configured to hold the upper or lower wafer $W_U$ or $W_L$ with a pin chuck system and to rotate the upper or lower wafer $W_U$ or $W_L$, and a detecting unit 123 configured to detect the position of a notch portion of the upper or lower wafer $W_U$ or $W_L$. The pin chuck system employed in the holding unit 122 is the same as a pin chuck system employed in an upper chuck 140 and a lower chuck 141 (which will be described later) and, therefore, will not be described here. In the position adjustment mechanism 120, the detecting unit 123 detects the position of the notch portion of the upper or lower wafer $W_U$ or $W_L$ while rotating the upper or lower wafer $W_U$ or $W_L$ held by the holding unit 122, and adjusts the position of the notch portion of the upper or lower wafer $W_U$ or $W_L$. Thus, the position adjustment mechanism 120 adjusts the orientation of the horizontal direction of the upper or lower wafer $W_U$ or $W_L$.

Figure 7:
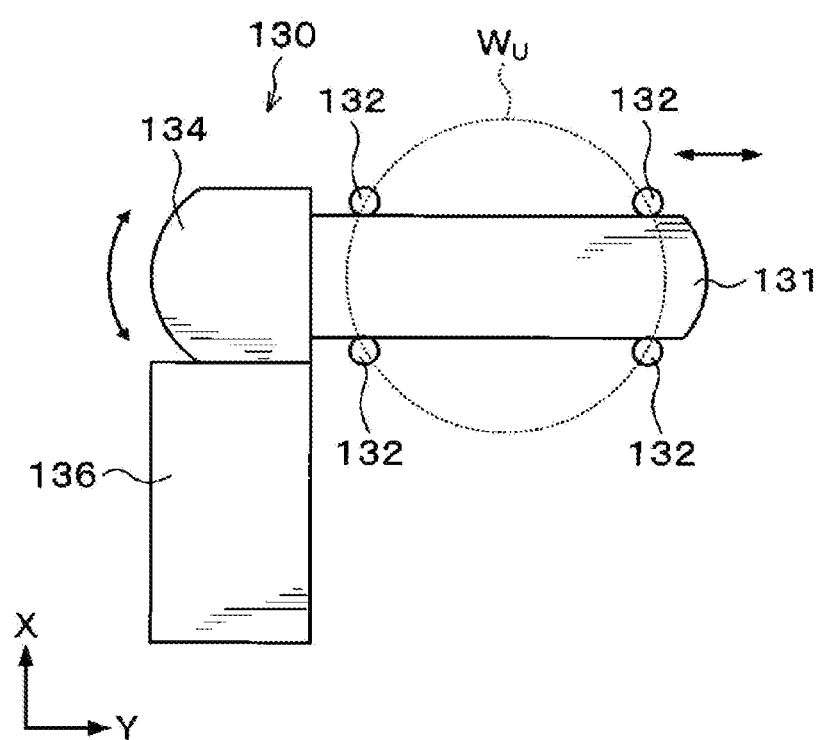
FIG. 7 is a plan view schematically showing a configuration of an inverting mechanism.
Figure 8:
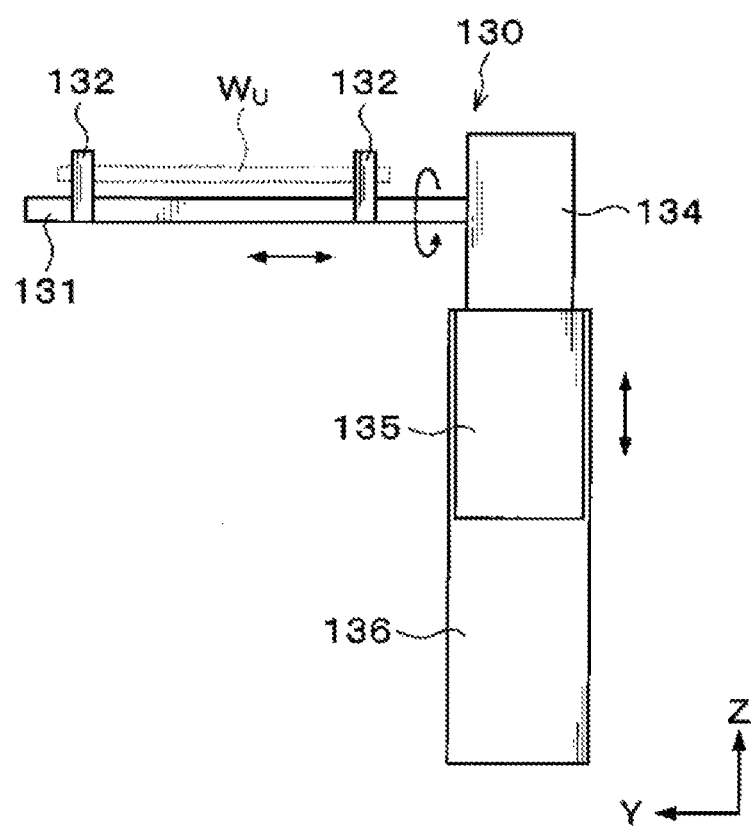
FIG. 8 is a side view schematically showing the configuration of an inverting mechanism.
Figure 9:
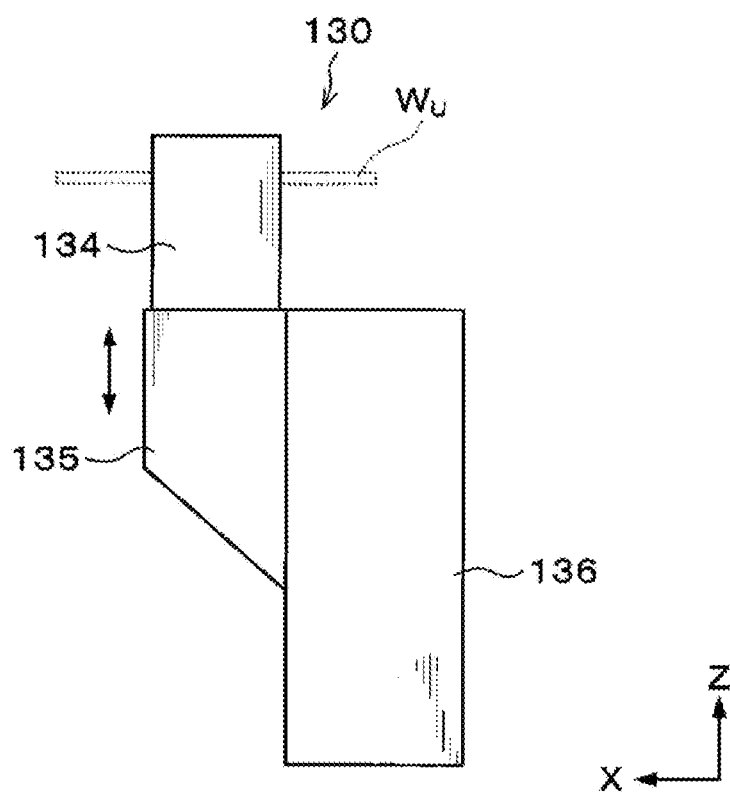
FIG. 9 is a side view schematically showing the configuration of the inverting mechanism.
Figure 10:
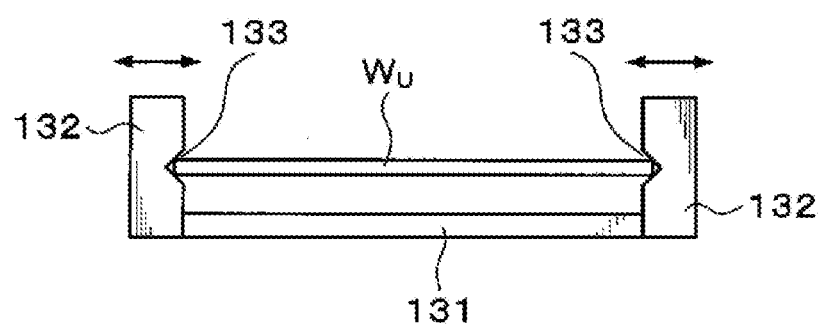
FIG. 10 is a side view schematically showing configurations of a holding arm and a holding member.

In the transfer region T1, as shown in FIGS. 4 and 5, there is also installed an inverting mechanism 130 configured to invert the front and rear surfaces $W_{U1}$ and $W_{U2}$ of the upper wafer $W_U$. As shown in FIGS. 7 to 9, the inverting mechanism 130 includes a holding arm 131 configured to hold the upper wafer $W_U$. The holding arm 131 extends in the horizontal direction (the Y-direction in FIGS. 7 and 8). In the holding arm 131, holding members 132 configured to hold the upper wafer $W_U$ are installed at, e.g., four points. As shown in FIG. 10, the holding members 132 are configured to move in the horizontal direction with respect to the holding arm 131. Cutouts 133 for holding the outer peripheral portion of the upper wafer $W_U$ are formed on side surfaces of the holding members 132. The holding members 132 can hold the upper wafer $W_U$ interposed therebetween by inserting the outer peripheral portion of the upper wafer $W_U$ into the cutouts 133.

As shown in FIGS. 7 to 9, the holding arm 131 is supported by a first drive unit 134 provided with, e.g., a motor and the like. The holding arm 131 is rotatable about a horizontal axis by the first drive unit 134. The holding arm 131 is not only rotatable about the first drive unit 134 but also movable in the horizontal direction (the Y-direction in FIGS. 7 and 8). A second drive unit 135 provided with, e.g., a motor and the like, is installed below the first drive unit 134. By virtue of the second drive unit 135, the first drive unit 134 is rotatable in the vertical direction (the Z-direction) along a support post 136 extending in the vertical direction. Thus, the upper wafer $W_U$ held by the holding members 132 is rotatable about the horizontal axis and is movable in the vertical and horizontal directions by the first drive unit 134 and the second drive unit 135. The upper wafer $W_U$ held by the holding members 132 can swing about the first drive unit 134 to move between the position adjustment mechanism 120 and the upper chuck 140 (which will be described later).

As shown in FIGS. 4 and 5, the upper chuck 140 used as a first holding unit and the lower chuck 141 used as a second holding unit are located in the processing region T2. The upper chuck 140 is configured to adsorptively hold the upper wafer $W_U$ on the lower surface thereof. The lower chuck 141 is configured to mount and adsorptively hold the lower wafer $W_L$ on the upper surface thereof. The lower chuck 141 is located below the upper chuck 140 while facing the upper chuck 140. That is to say, the upper wafer $W_U$ held by the upper chuck 140 and the lower wafer $W_L$ held by the lower chuck 141 can be arranged to face each other.

Figure 11:
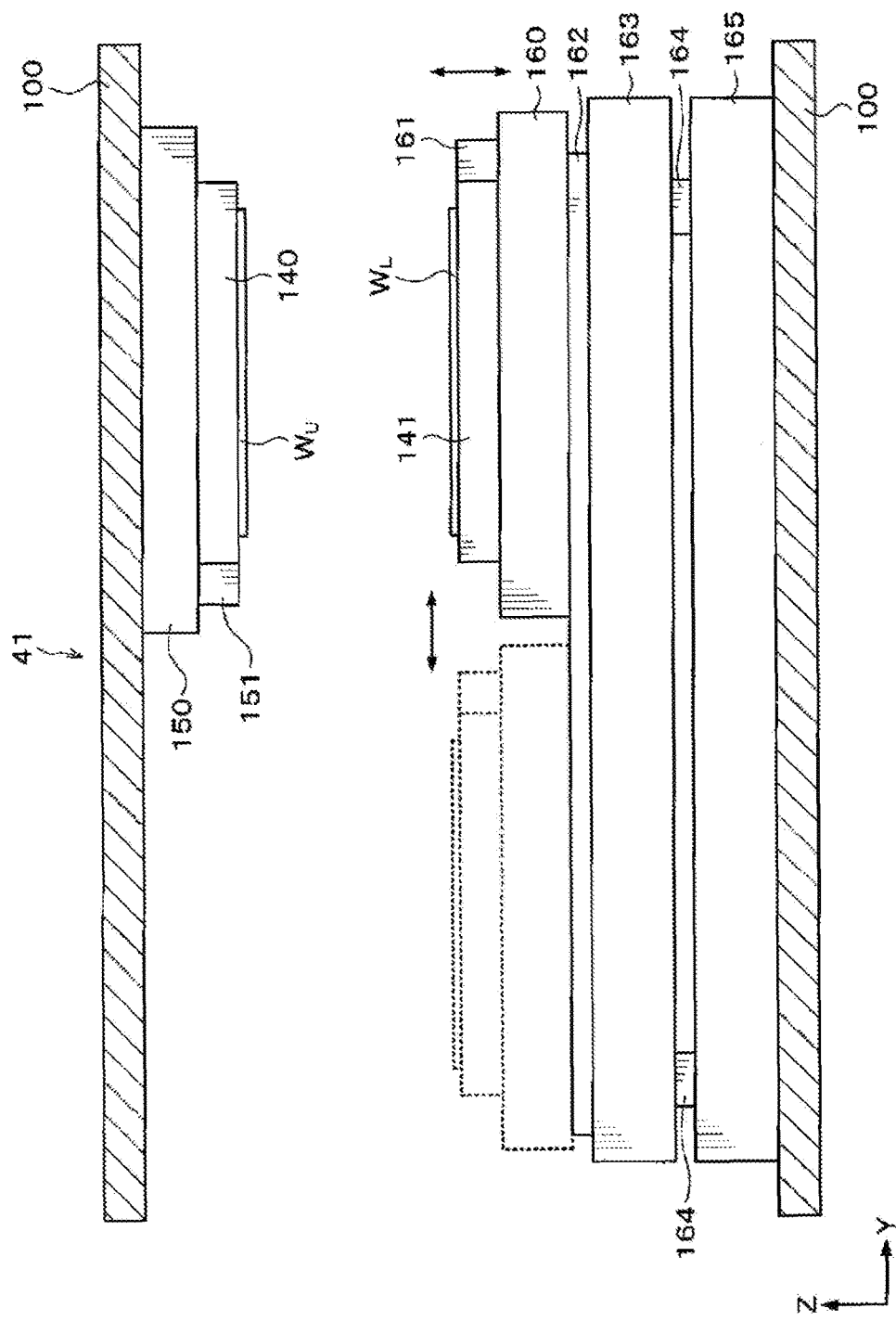
FIG. 11 is a side view schematically showing the internal configuration of a bonding device.

As shown in FIGS. 4, 5 and 11, the upper chuck 140 is supported by an upper chuck support unit 150 located above the upper chuck 140. The upper chuck support unit 150 is located on the ceiling surface of the processing vessel 100. That is to say, the upper chuck 140 is fixed to and installed in the processing vessel 100 through the upper chuck support unit 150.

An upper image pickup unit 151 is located in the upper chuck support unit 150 as a first image pickup unit to pick up an image of the front surface $W_{L1}$ of the lower wafer $W_L$ held by the lower chuck 141. That is to say, the upper image pickup unit 151 is located adjacent to the upper chuck 140. An example of the upper image pickup unit 151 may include a charge coupled device (CCD) camera.

As shown in FIGS. 4, 5 and 11, the lower chuck 141 is supported on a first lower chuck moving unit 160 installed below the lower chuck 141. As will be described later, the first lower chuck moving unit 160 is configured to move the lower chuck 141 in the horizontal direction (the Y-direction). Moreover, the first lower chuck moving unit 160 is configured to move the lower chuck 141 in the vertical direction and to rotate the lower chuck 141 about the vertical axis.

A lower image pickup unit 161 is located in the first lower chuck moving unit 160 to pick up an image of the front surface $W_{U1}$ of the upper wafer $W_U$ held by the upper chuck 140. That is to say, the lower image pickup unit 161 is located adjacent to the lower chuck 141. An example of the lower image pickup unit 161 may include a charge coupled device (CCD) camera.

As shown in FIGS. 4, 5 and 11, the first lower chuck moving unit 160 is located on a pair of rails 162 and 162 which are disposed at a lower surface side of the first lower chuck moving unit 160 and extend in the horizontal direction (the Y-direction). The first lower chuck moving unit 160 is configured to move along the pair of rails 162 and 162.

The pair of rails 162 and 162 are arranged in a second lower chuck moving unit 163. The second lower chuck moving unit 163 is located on a pair of rails 164 and 164 which are disposed at a lower surface side of the second lower chuck moving unit 163 and extend in the horizontal direction (the X-direction). The second lower chuck moving unit 163 is configured to move along the pair of rails 164 and 164. That is to say, the second lower chuck moving unit 163 is configured to move the lower chuck 141 in the horizontal direction (the X-direction). The pair of rails 164 and 164 are arranged on a mounting table 165 located on the bottom surface of the processing vessel 100.

Next, description will be made on the detailed configuration of the upper chuck 140 and the lower chuck 141 of the bonding device 41.

Figure 12:
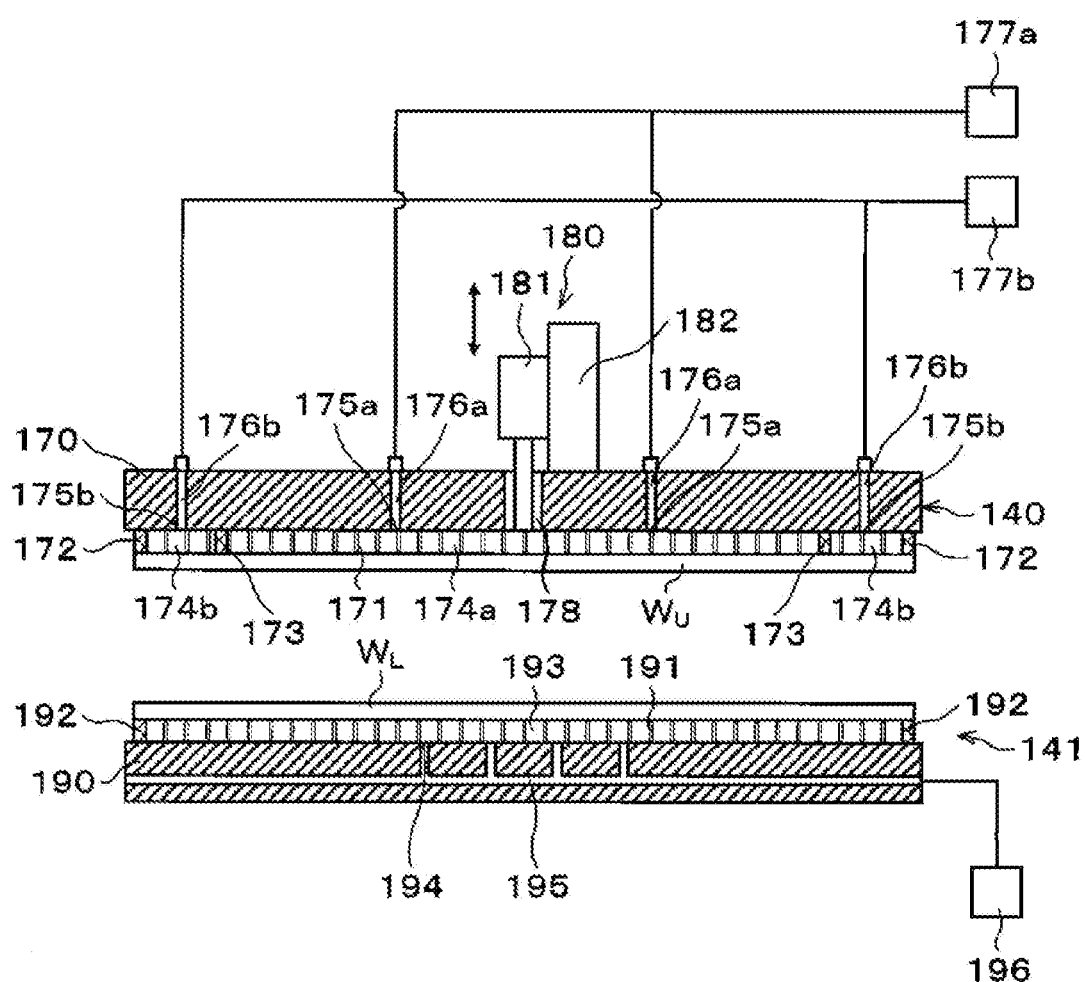
FIG. 12 is a vertical sectional view schematically showing configurations of an upper chuck and a lower chuck.
Figure 13:
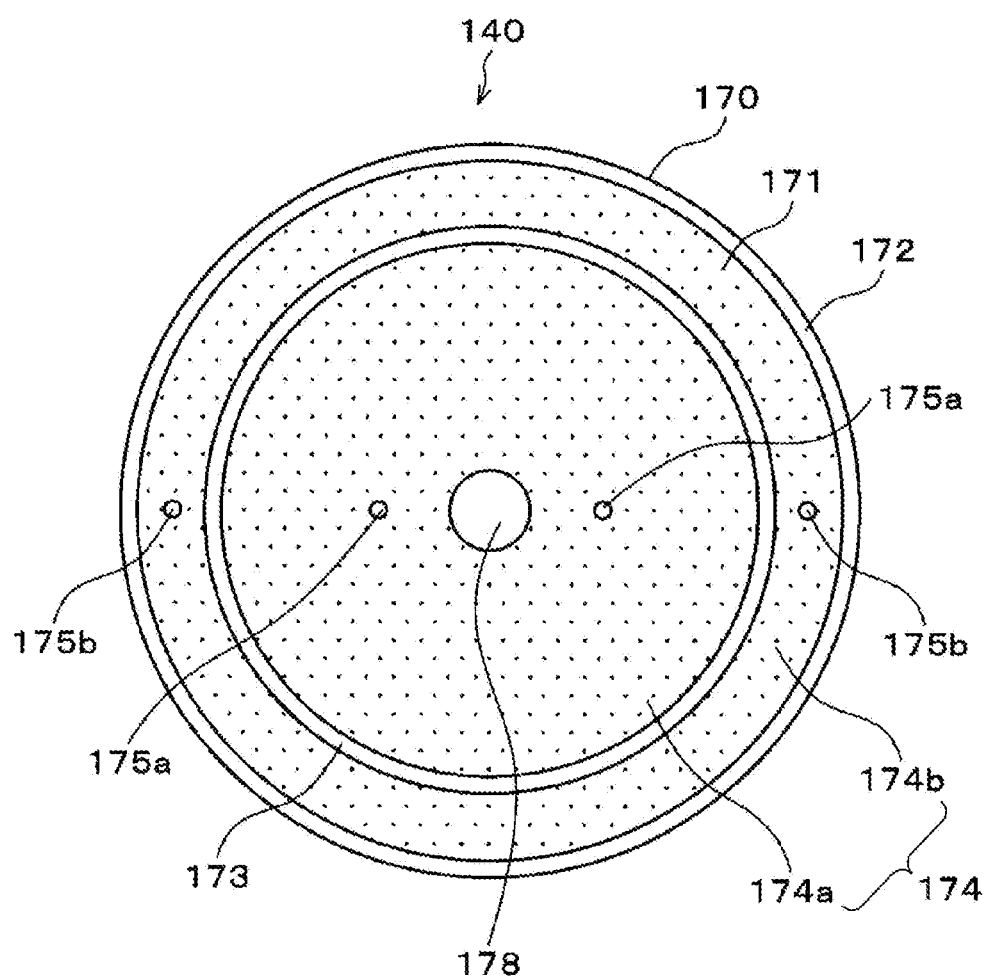
FIG. 13 is a plan view of an upper chuck when viewed from below.

As shown in FIGS. 12 and 13, the upper chuck 140 employs the pin chuck system as described above. The upper chuck 140 includes a body portion 170 having a diameter larger than the diameter of the upper wafer $W_U$ when viewed from the top. A plurality of pins 171 which makes contact with the rear surface $W_{U2}$ of the upper wafer $W_U$ is installed on a lower surface of the body portion 170. Each of the pins 171 has a diameter of, e.g., 0.1 mm to 1 mm and a height of, e.g., several tens of μm to several hundreds of μm. The pins 171 are evenly disposed at an interval of, e.g., 2 mm. Moreover, on the lower surface of the body portion 170, a support portion 172 is annularly installed at the outer side of the pins 171. The support portion 172 supports the outer peripheral portion of the rear surface $W_{U2}$ of the upper wafer $W_U$ so as to support at least the outer edge portion of the rear surface $W_{U2}$ of the upper wafer $W_U$. In this embodiment, the outer peripheral portion of the upper wafer $W_U$ defines as, e.g., a region up to 5 mm from the outer edge portion of the upper wafer $W_U$.

On the lower surface of the body portion 170, a partition wall portion 173 is installed at the inner side of the support portion 172. The partition wall portion 173 is annularly installed in a concentric relationship with the support portion 172. An inner region 174 (hereinafter sometimes referred to as a "suction region 174") of the support portion 172 is divided into a first suction region 174a existing at the inner side of the partition wall portion 173 and a second suction region 174b existing at the outer side of the partition wall portion 173.

On the lower surface of the body portion 170, first suction holes 175a for vacuum-drawing the upper wafer $W_U$ are formed in the first suction region 174a. The first suction holes 175a are formed at, e.g., two points in the first suction region 174a. The first suction holes 175a are connected to first suction pipes 176a installed within the body portion 170. The first suction pipes 176a are connected to a first vacuum pump 177a through joints.

On the lower surface of the body portion 170, second suction holes 175b for vacuum-drawing the upper wafer $W_U$ are formed in the second suction region 174b. The second suction holes 175b are formed at, e.g., two points in the second suction region 174b. The second suction holes 175b are connected to second suction pipes 176b installed within the body portion 170. The second suction pipes 176b are connected to a second vacuum pump 177b through joints.

The first and second suction regions 174a and 174b surrounded by the upper wafer $W_U$, the body portion 170 and the support portion 172 are vacuum-drawn from the first and second suction holes 175a and 175b, respectively, so that the first and second suction regions 174a and 174b are depressurized. At this time, the external environment of the first and second suction regions 174a and 174b is kept at the atmospheric pressure. Thus, the upper wafer $W_U$ is biased by the atmospheric pressure toward the first and second suction regions 174a and 174b just as much as the depressurized amount. Consequently, the upper wafer $W_U$ is held by the upper chuck 140. Moreover, the upper chuck 140 is configured to vacuum-draw the upper wafer $W_U$ in each of the first suction region 174a and the second suction region 174b.

Since the support portion 172 supports the outer edge portion of the rear surface $W_{U2}$ of the upper wafer $W_U$, the upper wafer $W_U$ is appropriately vacuum-drawn up to the outer peripheral portion thereof. Thus, the entire surface of the upper wafer $W_U$ is held by the upper chuck 140. This further flattens the upper wafer $W_U$, thus making the upper wafer $W_U$ flatter.

Inasmuch as the heights of the pins 171 are uniform, it is possible to further reduce the flatness of the lower surface of the upper chuck 140. By making the lower surface of the upper chuck 140 flat (by reducing the flatness of the lower surface of the upper chuck 140) in this way, it is possible to suppress vertical distortion of the upper wafer $W_U$ held by the upper chuck 140.

Since the rear surface $W_{U2}$ of the upper wafer $W_U$ is supported by the pins 171, the upper wafer $W_U$ is easily separated from the upper chuck 140 when the upper chuck 140 releases the vacuum-drawing of the upper wafer $W_U$.

In the upper chuck 140, a through-hole 178 extending through the body portion 170 in a thickness direction is formed in the central portion of the body portion 170. The central portion of the body portion 170 corresponds to the central portion of the upper wafer $W_U$ held by the upper chuck 140. A tip portion of an actuator part 181 of a pressing member 180 (which will be described later) is inserted into the through-hole 178.

The pressing member 180 configured to press the central portion of the upper wafer $W_U$ is installed on the upper surface of the upper chuck 140. The pressing member 180 includes the actuator part 181 and a cylinder part 182.

The actuator part 181 generates a constant pressure in a specified direction using air supplied from an electro-pneumatic regulator (not shown). The actuator part 181 can constantly generate the pressure regardless of the position of a pressure action point. By virtue of the air supplied from the electro-pneumatic regulator, the actuator part 181 can make contact with the central portion of the upper wafer $W_U$ and can control a pressing load applied to the central portion of the upper wafer $W_U$. Furthermore, the tip portion of the actuator part 181 can be vertically moved up and down through the through-hole 178 by virtue of the air supplied from the electro-pneumatic regulator.

The actuator part 181 is supported by the cylinder part 182. The cylinder part 182 can vertically move the actuator part 181 using, e.g., a drive unit including a motor installed therein.

As mentioned above, the pressing member 180 controls the pressing load using the actuator part 181 and controls the movement of the actuator part 181 using the cylinder part 182. When bonding the wafers $W_U$ and $W_L$ together, the pressing member 180 can bring the central portion of the upper wafer $W_U$ into contact with the central portion of the lower wafer $W_L$ and can press the central portion of the upper wafer $W_U$ against the central portion of the lower wafer $W_L$.

Figure 14:
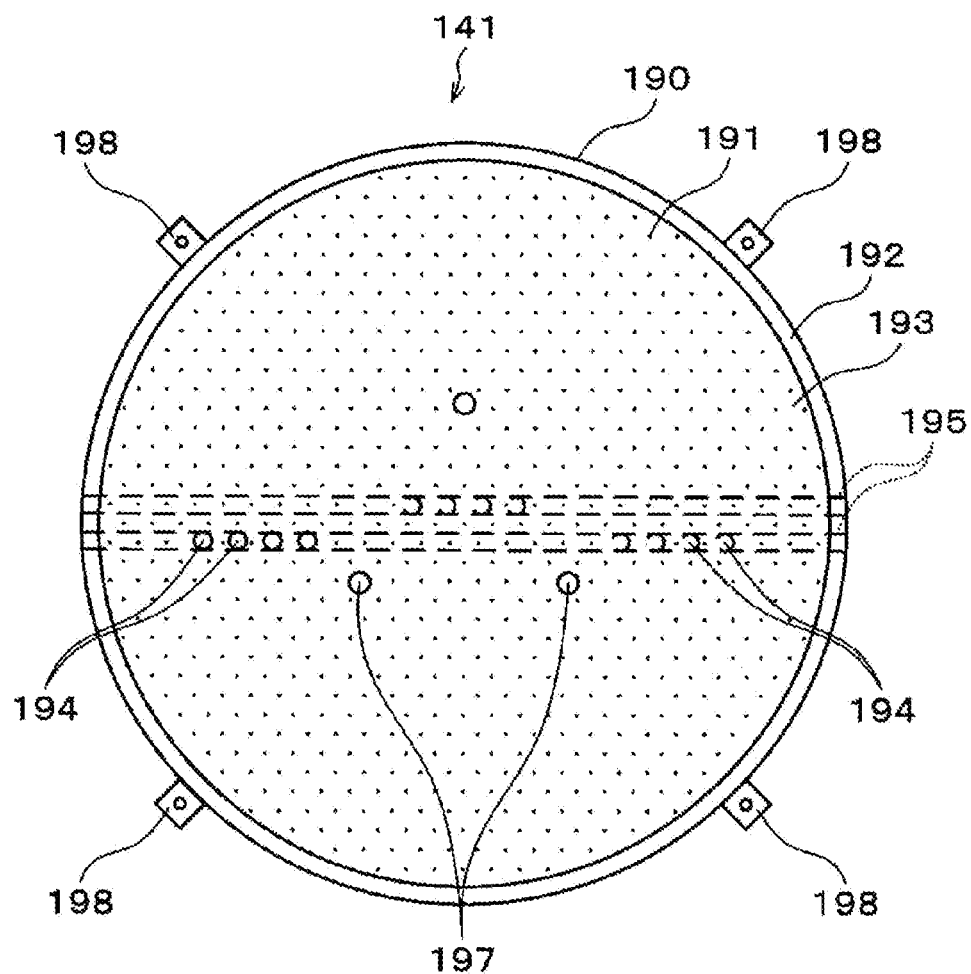
FIG. 14 is a plan view of the lower chuck when viewed from above.

As shown in FIGS. 12 and 14, just like the upper chuck 140, the lower chuck 141 employs the pin chuck system as described above. The lower chuck 141 includes a body portion 190 having a diameter larger than the diameter of the lower wafer $W_L$ when viewed from the top. A plurality of pins 191 which makes contact with the rear surface $W_{L2}$ of the lower wafer $W_L$ is installed on the upper surface of the body portion 190. Each of the pins 191 has a diameter of, e.g., 0.1 mm to 1 mm and a height of, e.g., several tens of μm to several hundreds of μm. The pins 191 are evenly disposed at an interval of, e.g., 0.5 mm to 2 mm. Moreover, on the upper surface of the body portion 190, a support portion 192 is annularly installed at the outer side of the pins 191. The support portion 192 supports the outer peripheral portion of the rear surface $W_{L2}$ of the lower wafer $W_L$ so as to support at least the outer edge portion of the rear surface $W_{L2}$ of the lower wafer $W_L$. In this embodiment, the outer peripheral portion of the lower wafer $W_L$ defines as, e.g., a region up to 5 mm from the outer edge portion of the lower wafer $W_L$.

In the upper surface of the body portion 190, a plurality of suction holes 194 are formed for vacuum-drawing the lower wafer $W_L$ in an inner region 193 of the support portion 192 (hereinafter sometimes referred to as a "suction region 193"). The suction holes 194 are connected to suction pipes 195 installed within the body portion 190. There are installed, e.g., two suction pipes 195. The suction pipes 195 are connected to a vacuum pump 196.

The suction region 193 surrounded by the lower wafer $W_L$, the body portion 190 and the support portion 192 is vacuum-drawn from the suction holes 194 so that the suction region 193 is depressurized. At this time, the external environment of the suction region 193 is kept at the atmospheric pressure. Thus, the lower wafer $W_L$ is biased by the atmospheric pressure toward the suction region 193 just as much as the depressurized amount. Consequently, the lower wafer $W_L$ is held by the lower chuck 141.

Figure 15:
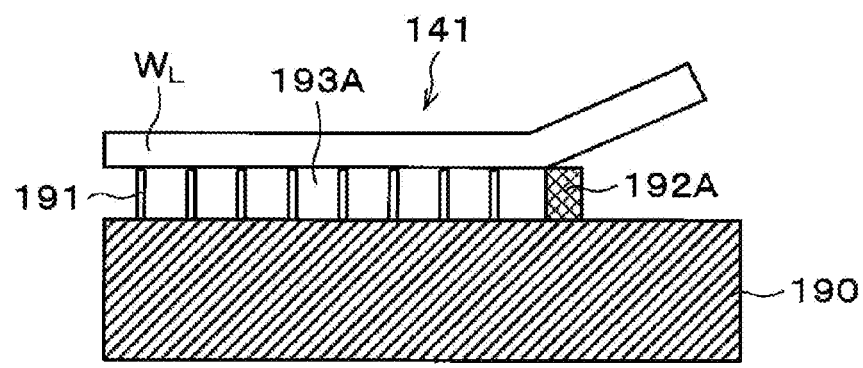
FIG. 15 is an enlarged explanatory view of an outer peripheral portion of a lower chuck in a comparative example.

Now, the position of the support portion 192 of the body portion 190 will be described in detail. For example, in a comparative example, if a support portion 192A is disposed more inward than the outer edge portion of the rear surface $W_{L2}$ of the lower wafer $W_L$ as shown in FIG. 15, a suction region 193A is also defined more inward than the outer edge portion of the rear surface $W_{L2}$ of the lower wafer $W_L$. In this case, as a result of intensive studies conducted by the present inventors, it was found that, when the lower wafer $W_L$ is held by the lower chuck 141, the outer peripheral portion of the lower wafer $W_L$ is bent upward from the support portion 192A.

Figure 16:
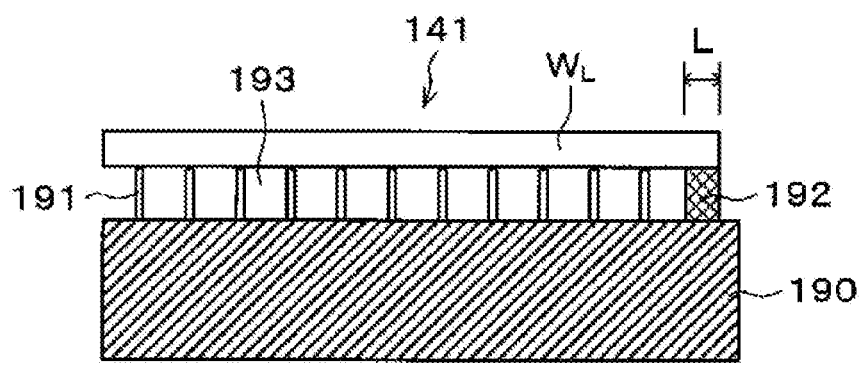
FIG. 16 is an enlarged explanatory view of an outer peripheral portion of a lower chuck in one embodiment.

In contrast, in this embodiment, the support portion 192 supports the outer edge portion of the rear surface $W_{L2}$ of the lower wafer $W_L$ as shown in FIG. 16. Thus, the lower wafer $W_L$ is appropriately vacuum-drawn up to the outer peripheral portion thereof. Consequently, the entire surface of the lower wafer $W_L$ is held by the lower chuck 141. This further flattens the lower wafer $W_L$, thus making the lower wafer $W_L$ flatter.

Inasmuch as heights of the pins 191 are uniform, it is possible to further flattens the upper surface of the lower chuck 141. This makes it possible to further flatten the lower wafer $W_L$ held by the lower chuck 141, thus suppressing vertical distortion of the lower wafer $W_L$.

Figure 17:
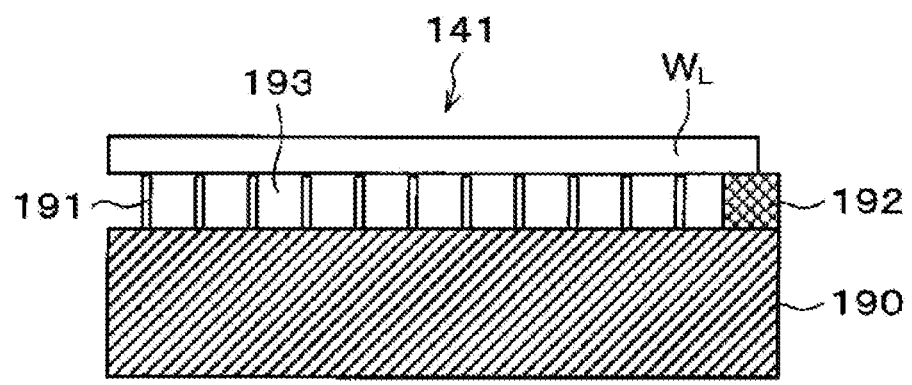
FIG. 17 is an enlarged explanatory view of an outer peripheral portion of a lower chuck in another embodiment.

In FIG. 16, the position of the outer edge portion of the support portion 192 coincides with the position of the outer edge portion of the lower wafer $W_L$. However, it is only necessary that the support portion 192 supports the outer edge portion of the rear surface $W_{L2}$ of the lower wafer $W_L$. As an example, as shown in FIG. 17, the support portion 192 may be installed to extend outward beyond the outer edge portion of the rear surface $W_{L2}$ of the lower wafer $W_L$.

Next, description will be made on the size of the support portion 192. The width L of the support portion 192 shown in FIG. 16 is decided as small as possible insofar as the support portion 192 can support the outer peripheral portion of the lower wafer $W_L$ when the lower chuck 141 vacuum-draws the outer peripheral portion of the lower wafer $W_L$. That is to say, the contact area of the support portion 192 with the outer peripheral portion of the lower wafer $W_L$ is set as small as possible. Specifically, the width L of the support portion 192 is, e.g., 0.25 mm. This configuration prevents particles from existing on the upper surface of the support portion 192, thus suppressing the vertical distortion of the lower wafer $W_L$.

Since the rear surface $W_{L2}$ of the lower wafer $W_L$ is supported by the pins 191, the lower wafer $W_L$ is easily separated from the lower chuck 141 when the lower chuck 141 releases the vacuum-drawing of the lower wafer $W_L$.

As shown in FIG. 14, through-holes 197 extending through the body portion 190 in the thickness direction are formed at, e.g., three points, in and around the central portion of the body portion 190 of the lower chuck 141. Lift pins (not shown) installed below the first lower chuck moving unit 160 are inserted into the through-holes 197.

Guide members 198 configured to prevent the upper or lower wafer $W_U$ or $W_L$ or the overlapped wafer $W_T$ from jumping out and sliding down from the lower chuck 141 are installed in the outer peripheral portion of the body portion 190. The guide members 198 are installed at a plurality of points, e.g., four points, at a regular interval in the outer peripheral portion of the body portion 190.

Operations of the respective parts of the bonding device 41 are controlled by the aforementioned control unit 70.

Figure 18:
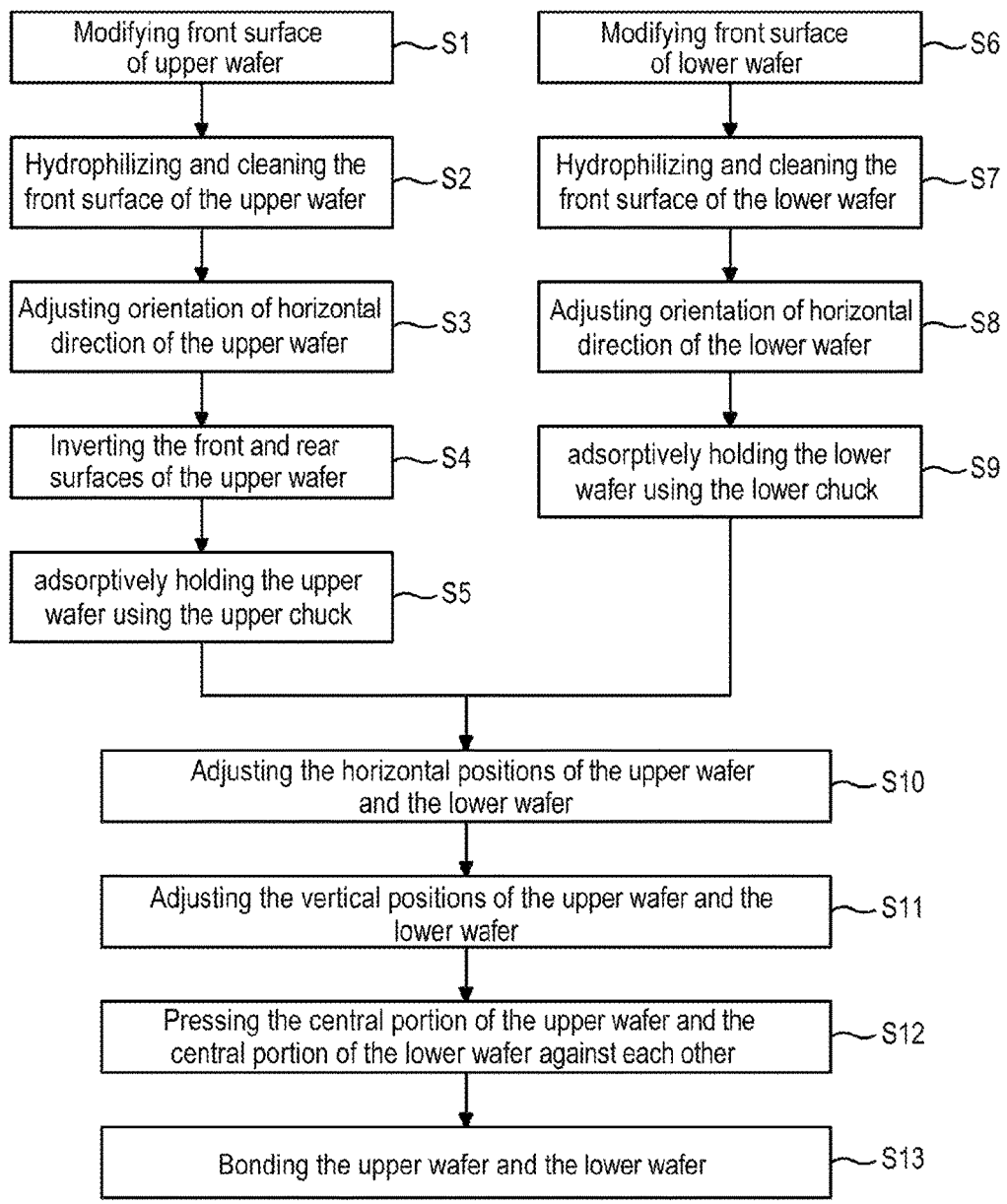
FIG. 18 is a flowchart illustrating major steps of a wafer bonding process.

Next, description will be made on a process of bonding the upper and lower wafers $W_U$ and $W_L$ using the bonding system 1 configured as above. FIG. 18 is a flowchart illustrating examples of major steps of the wafer bonding process.

First, the cassette $C_U$ in which a plurality of upper wafers $W_U$ is accommodated, the cassette $C_L$ in which a plurality of lower wafers $W_L$ is accommodated and the empty cassette $C_T$ are mounted on the respective cassette mounting boards 11 of the carry-in/carry-out station 2. Thereafter, the upper wafer $W_U$ is taken out of the cassette $C_U$ by the wafer transfer device 22 and is transferred to the transition device 50 of the third processing block G3 of the processing station 3.

Then, the upper wafer $W_U$ is transferred to the surface modifying device 30 of the first processing block G1 by the wafer transfer device 61. In the surface modifying device 30, an oxygen gas and a nitrogen gas as process gases are excited, converted to plasma and ionized under a specified depressurized environment. The oxygen ions and the nitrogen ions thus generated are irradiated on the front surface $W_{U1}$ of the upper wafer $W_U$, whereby the front surface $W_{U1}$ is plasma-processed. Thus, the front surface $W_{U1}$ of the upper wafer $W_U$ is modified (Step S1 in FIG. 18).

Next, the upper wafer $W_U$ is transferred to the surface hydrophilizing device 40 of the second processing block G2 by the wafer transfer device 61. In the surface hydrophilizing device 40, pure water is supplied onto the upper wafer $W_U$ while rotating the upper wafer $W_U$ held by a spin chuck. The supplied pure water is diffused on the front surface $W_{U1}$ of the upper wafer $W_U$. Hydroxyl groups (silanol groups) adhere to the front surface $W_{U1}$ of the upper wafer $W_U$ modified in the surface modifying device 30 so that the front surface $W_{U1}$ is hydrophilized. Furthermore, the front surface $W_{U1}$ of the upper wafer $W_U$ is cleaned by the pure water (Step S2 in FIG. 18).

Then, the upper wafer $W_U$ is transferred to the bonding device 41 of the second processing block G2 by the wafer transfer device 61. The upper wafer $W_U$ carried into the bonding device 41 is transferred to the position adjustment mechanism 120 through the transition 110 by the wafer transfer mechanism 111 (see FIG. 4). The orientation of the horizontal direction of the upper wafer $W_U$ is adjusted by the position adjustment mechanism 120 (Step S3 in FIG. 18).

Thereafter, the upper wafer $W_U$ is delivered from the position adjustment mechanism 120 to the holding arm 131 of the inverting mechanism 130. Subsequently, in the transfer region T1, the holding arm 131 is inverted to invert the front and rear surfaces of the upper wafer $W_U$ (Step S4 in FIG. 18). That is to say, the front surface $W_{U1}$ of the upper wafer $W_U$ is oriented downward.

Thereafter, the holding arm 131 of the inverting mechanism 130 rotates about the first drive unit 134 and moves below the upper chuck 140. Then, the upper wafer $W_U$ is delivered from the inverting mechanism 130 to the upper chuck 140. The rear surface $W_{U2}$ of the upper wafer $W_U$ is adsorptively held by the upper chuck 140 (Step S5 in FIG. 18). More specifically, the vacuum pumps 177a and 177b are operated to vacuum-draw the first and second suction regions 174*a* and 174*b* from the first and second suction holes 175*a* and 175*b*. Thus, the upper wafer $W_U$ is adsorptively held by the upper chuck 140.

During the time when the processing of steps S1 to S5 is performed with respect to the upper wafer $W_U$, the lower wafer $W_L$ is processed. First, the lower wafer $W_L$ is taken out from the cassette $C_L$ by the wafer transfer device 22 and is transferred to the transition device 50 of the processing station 3.

Next, by the wafer transfer device 61, the lower wafer $W_L$ is transferred to the surface modifying device 30 where the front surface $W_{L1}$ of the lower wafer $W_L$ is modified (Step S6 in FIG. 18). The modification of the front surface $W_{L1}$ of the lower wafer $W_L$ performed in Step S6 is the same as the modification performed in Step S1.

Thereafter, by the wafer transfer device 61, the lower wafer $W_L$ is transferred to the surface hydrophilizing device 40 where the front surface $W_{L1}$ of the lower wafer $W_L$ is hydrophilized and cleaned (Step S7 in FIG. 18). The hydrophilizing and cleaning of the front surface $W_{L1}$ of the lower wafer $W_L$ performed in Step S7 is the same as the hydrophilizing and cleaning performed in Step S2.

Thereafter, the lower wafer $W_L$ is transferred to the bonding device 41 by the wafer transfer device 61. The lower wafer $W_L$ carried into the bonding device 41 is transferred to the position adjustment mechanism 120 through the transition 110 by the wafer transfer mechanism 111. The orientation of the horizontal direction of the lower wafer $W_L$ is adjusted by the position adjustment mechanism 120 (Step S8 in FIG. 18).

Thereafter, the lower wafer $W_L$ is transferred to the lower chuck 141 by the wafer transfer mechanism 111. The rear surface $W_{L2}$ of the lower wafer $W_L$ is adsorptively held by the lower chuck 141 (Step S9 in FIG. 18). More specifically, the vacuum pump 196 is operated to vacuum-draw the suction region 193 from the suction holes 194, whereby the lower wafer $W_L$ is adsorptively held by the lower chuck 141.

Figure 19:
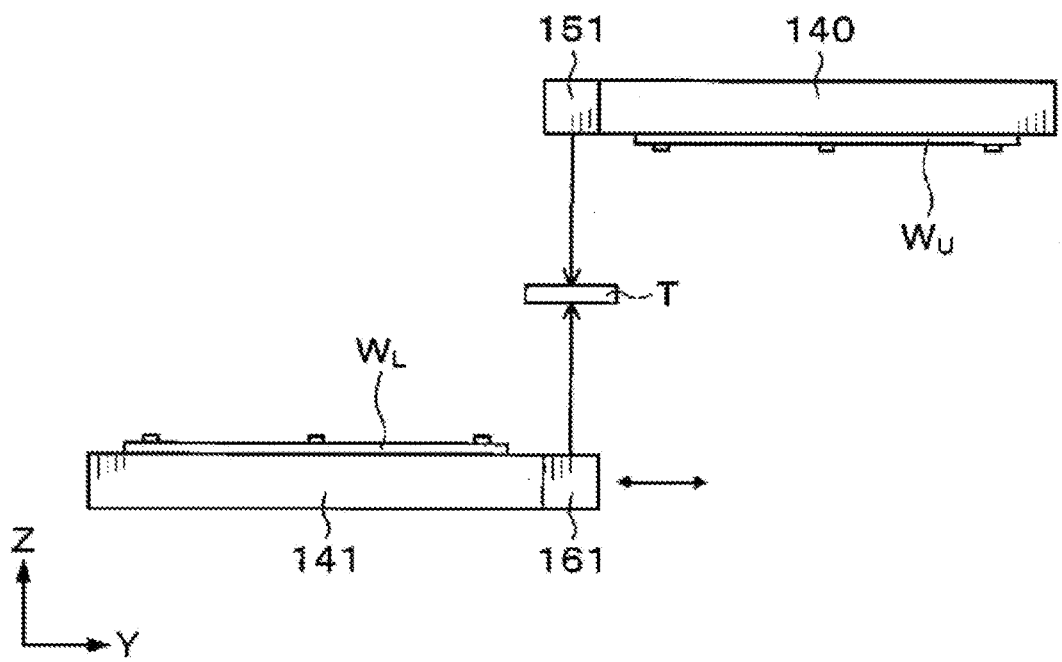
FIG. 19 is an explanatory view illustrating how to adjust horizontal positions of upper and lower image pickup units.

Next, as shown in FIG. 19, the horizontal positions of the upper image pickup unit 151 and the lower image pickup unit 161 are adjusted. More specifically, the lower chuck 141 is moved in the horizontal direction (in the X-direction and the Y-direction) by the first lower chuck moving unit 160 and the second lower chuck moving unit 163 such that the lower image pickup unit 161 is positioned substantially below the upper image pickup unit 151. Then, the upper image pickup unit 151 and the lower image pickup unit 161 identify a common target T. The horizontal position of the lower image pickup unit 161 is adjusted such that the horizontal positions of the upper image pickup unit 151 and the lower image pickup unit 161 coincide with each other. At this time, it is only necessary to move the lower image pickup unit 161 because the upper image pickup unit 151 is fixed to the processing vessel 100. This makes it possible to appropriately adjust the horizontal positions of the upper image pickup unit 151 and the lower image pickup unit 161.

Figure 20:
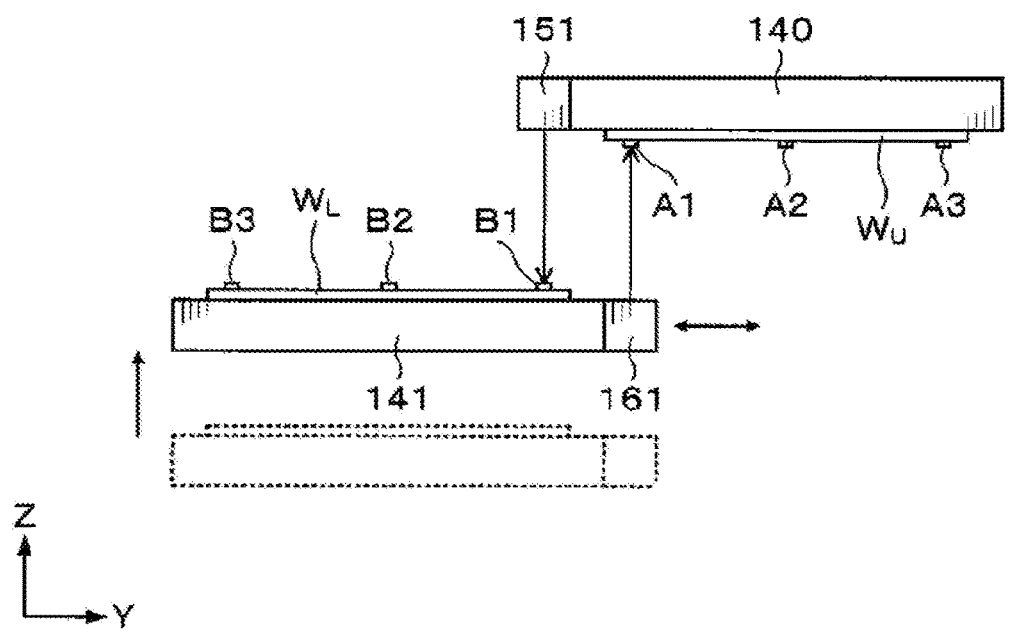
FIG. 20 is an explanatory view illustrating how to adjust horizontal positions of upper and lower chucks.

Then, as shown in FIG. 20, the lower chuck 141 is moved vertically upward by the first lower chuck moving unit 160. Thereafter, the horizontal positions of the upper chuck 140 and the lower chuck 141 are adjusted to thereby adjust the horizontal position of the upper wafer $W_U$ held by the upper chuck 140 and the horizontal position of the lower wafer $W_L$ held by the lower chuck 141.

A plurality of, e.g., three, predetermined reference points A1 to A3 are defined on the front surface $W_{U1}$ of the upper wafer $W_U$. Similarly, a plurality of, e.g., three, predetermined reference points B1 to B3 are defined on the front surface $W_{L1}$ of the lower wafer $W_L$. The reference points A1 and A3 and the reference points B1 and B3 are reference points of the outer peripheral portions of the upper wafer $W_U$ and the lower wafer $W_L$. The reference points A2 and B2 are reference points of the central portions of the upper wafer $W_U$ and the lower wafer $W_L$. In some embodiments, specific patterns formed on the upper wafer $W_U$ and the lower wafer $W_L$ may be used as the reference points A1 to A3 and the reference points B1 to B3.

Figure 21:
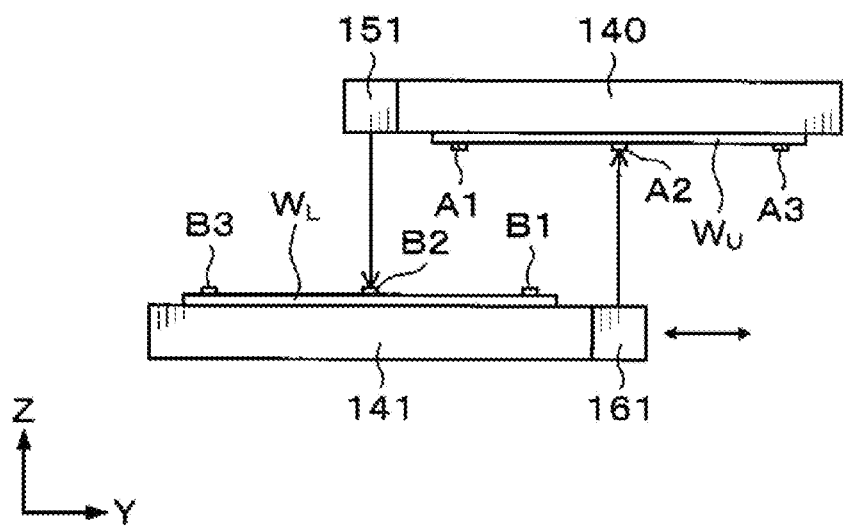
FIG. 21 is an explanatory view illustrating how to adjust horizontal positions of upper and lower chucks.

As shown in FIGS. 20 and 21, the lower chuck 141 is moved in the horizontal direction (in the X-direction and the Y-direction) by the first lower chuck moving unit 160 and the second lower chuck moving unit 163. Images of the reference points B1 to B3 of the front surface $W_{L1}$ of the lower wafer $W_L$ are sequentially picked up by the upper image pickup unit 151. Concurrently, images of the reference points A1 to A3 of the front surface $W_{U1}$ of the upper wafer $W_U$ are sequentially picked up by the lower image pickup unit 161. The images thus picked up are outputted to the control unit 70. Based on the images picked up by the upper image pickup unit 151 and the lower image pickup unit 161, the control unit 70 controls the first lower chuck moving unit 160 and the second lower chuck moving unit 163 to move the lower chuck 141 to a position where the reference points A1 to A3 of the upper wafer $W_U$ coincide with the reference points B1 to B3 of the lower wafer $W_L$. In this way, the horizontal positions of the upper wafer $W_U$ and the lower wafer $W_L$ are adjusted (Step S10 in FIG. 18). At this time, since the upper chuck 140 is fixed to the processing vessel 100, it is only necessary to move the lower chuck 141. As a result, it is possible to appropriately adjust the horizontal positions of the upper chuck 140 and the lower chuck 141, thus appropriately adjusting the horizontal positions of the upper wafer $W_U$ and the lower wafer $W_L$.

Figure 22:
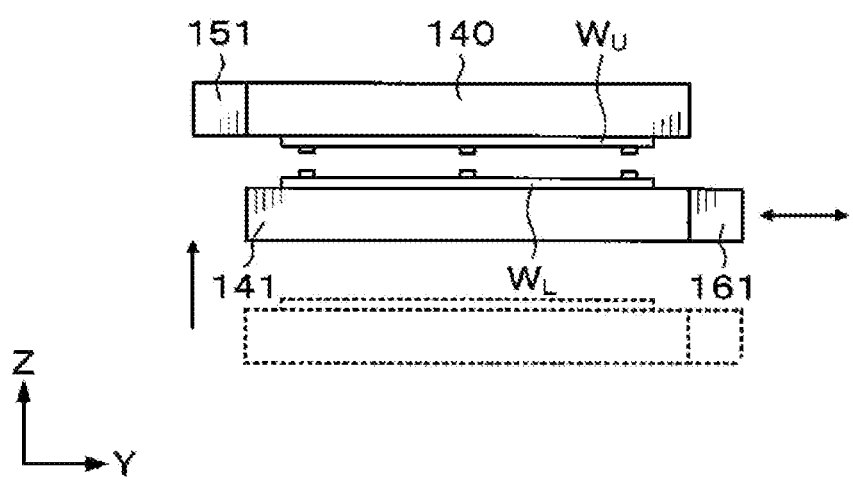
FIG. 22 is an explanatory view illustrating how to adjust vertical positions of the upper and lower chucks.

Thereafter, as shown in FIG. 22, the lower chuck 141 is moved vertically upward by the first lower chuck moving unit 160 such that the vertical positions of the upper chuck 140 and the lower chuck 141 are adjusted. Thus, the vertical position of the upper wafer $W_U$ held by the upper chuck 140 and the vertical position of the lower wafer $W_L$ held by the lower chuck 141 are adjusted (Step S11 in FIG. 18). At this time, the gap between the front surface $W_U$ of the lower wafer $W_L$ and the front surface $W_{U1}$ of the upper wafer $W_U$ is set to be equal to a predetermined distance, e.g., 50 μm to 200 μm.

Next, a process of bonding the upper wafer $W_U$ held by the upper chuck 140 and the lower wafer $W_L$ held by the lower chuck 141 is performed.

Figure 23:
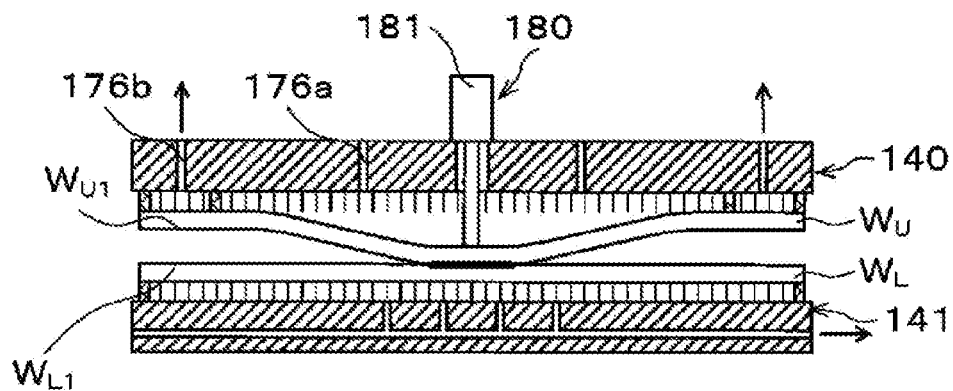
FIG. 23 is an explanatory view illustrating how to bring the central portion of the upper wafer into contact with the central portion of the lower wafer by pressing the central portion of the upper wafer against the central portion of the lower wafer.

First, as shown in FIG. 23, the actuator part 181 is moved downward by the cylinder part 182 of the pressing member 180, thereby moving the upper wafer $W_U$ downward while pressing the central portion of the upper wafer $W_U$. At this time, by virtue of the air supplied from the electro-pneumatic regulator, a predetermined pressing load of, e.g., 200 g to 250 g, is applied to the actuator part 181. By virtue of the pressing member 180, the central portion of the upper wafer $W_U$ is brought into contact with, and is pressed against, the central portion of the lower wafer $W_L$ (Step S12 in FIG. 18). At this time, the operation of the first vacuum pump 177*a* is stopped such that the vacuum-drawing of the upper wafer $W_U$ from the first suction pipes 176*a* in the first suction region 174*a* is stopped. The operation of the second vacuum pump 177*b* is maintained such that the upper wafer $W_U$ is vacuum-drawn from the second suction holes 175*b* in the second suction region 174*b*. Thus, even when the central portion of the upper wafer $W_U$ is pressed by the pressing member 180, the upper chuck 140 can hold the outer peripheral portion of the upper wafer $W_U$.

Then, bonding begins to occur between the central portion of the upper wafer $W_U$ and the central portion of the lower wafer $W_L$ pressed against each other (see the portion indicated by a thick line in FIG. 23). That is to say, since the front surface $W_{U1}$ of the upper wafer $W_U$ and the front surface $W_{L1}$ of the lower wafer $W_L$ are previously modified in Steps S1 and S6, a Van der Waals force (an intermolecular force) is generated between the front surfaces $W_{U1}$ and $W_{L1}$, whereby the front surfaces $W_{U1}$ and $W_U$ are bonded to each other. Furthermore, since the front surface $W_{U1}$ of the upper wafer $W_U$ and the front surface $W_U$ of the lower wafer $W_L$ are previously hydrophilized in Steps S2 and S7, the hydrophilic groups existing between the front surfaces $W_{U1}$ and $W_{L1}$ are hydrogen-bonded (by an intermolecular force), whereby the front surfaces $W_{U1}$ and $W_{L1}$ are strongly bonded to each other.

Figure 24:
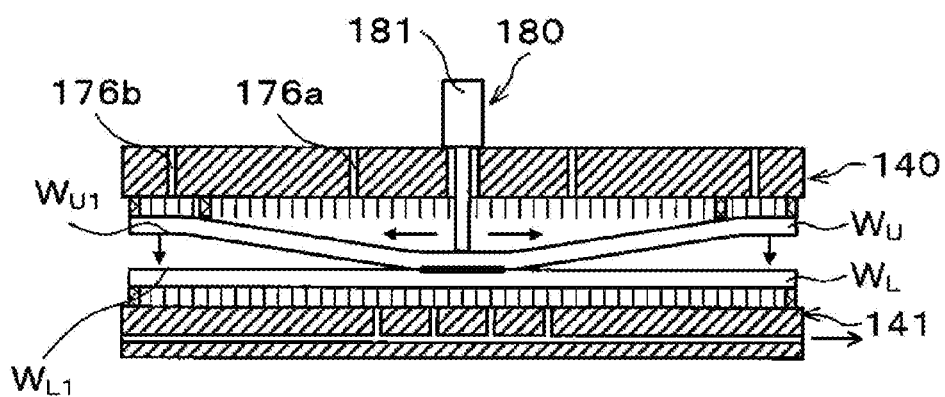
FIG. 24 is an explanatory view illustrating how to sequentially bring the upper wafer into contact with the lower wafer.
Figure 25:
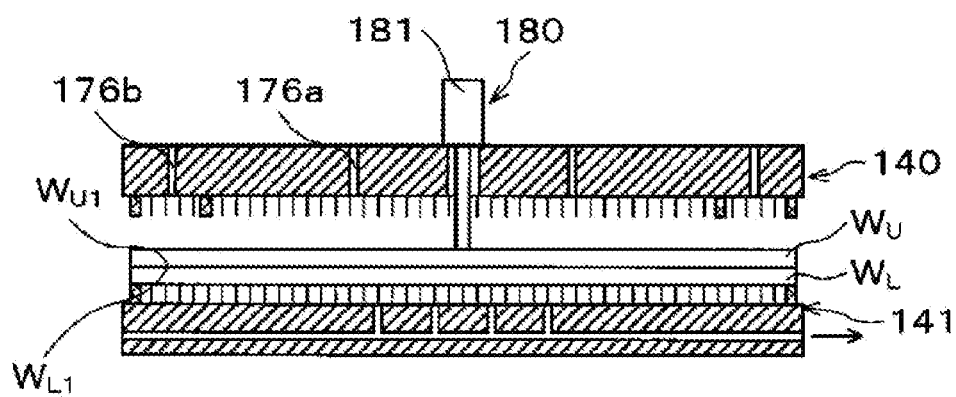
FIG. 25 is an explanatory view showing how to bring a front surface of the upper wafer into contact with a front surface of the lower wafer.

Thereafter, as shown in FIG. 24, the vacuum-drawing of the upper wafer WU from the second suction pipes 176b in the second suction region 174b is stopped by stopping the operation of the second vacuum pump 177b in such a state that the central portion of the upper wafer $W_U$ and the central portion of the lower wafer $W_L$ are pressed against each other by the pressing member 180. By doing so, the upper wafer $W_U$ is dropped onto the lower wafer $W_L$. Since the rear surface $W_{U2}$ of the upper wafer $W_U$ is supported by the pins 171, the upper wafer $W_U$ is easily detached from the upper chuck 140 upon releasing the vacuum-drawing of the upper wafer $W_U$ performed by the upper chuck 140. Then, the vacuum-drawing of the upper wafer $W_U$ is stopped from the central portion of the upper wafer $W_U$ toward the outer peripheral portion thereof. Thus, the upper wafer $W_U$ is gradually dropped onto, and gradually brought into contact with, the lower wafer $W_L$, whereby the bonding area between the front surfaces $W_{U1}$ and $W_{L1}$ is gradually widened by the Van der Waals force and the hydrogen bonding. Consequently, as shown in FIG. 25, the front surface $W_{U1}$ of the upper wafer $W_U$ and the front surface $W_{L1}$ of the lower wafer $W_L$ make contact with each other over the entire area thereof, whereby the upper wafer $W_U$ and the lower wafer $W_L$ are bonded to each other (Step S13 in FIG. 18).

In Step S13, for example, if the outer peripheral portion of the lower wafer $W_L$ extends vertically upward as shown in FIG. 15, the distance between the outer peripheral portion of the upper wafer $W_U$ and the outer peripheral portion of the lower wafer $W_L$ becomes smaller. In that case, when the upper wafer $W_U$ drops onto the lower wafer $W_L$, the air existing between the wafers $W_U$ and $W_L$ cannot be completely expelled to the outside beyond the outer peripheral portions. Thus, it is sometimes the case that the upper wafer $W_U$ makes contact with the lower wafer $W_L$ before the air flows out. This may cause a void in the bonded overlapped wafer $W_T$.

In this embodiment, as shown in FIG. 16, the entire surface of the lower wafer $W_L$ is adsorptively held by the lower chuck 141 so that the lower wafer $W_L$ becomes flat up to the outer peripheral portion thereof. Moreover, the entire surface of the upper wafer $W_U$ is adsorptively held by the upper chuck 140 so that the upper wafer $W_U$ becomes flat up to the outer peripheral portion thereof. With this configuration, the air existing between the wafers $W_U$ and $W_L$ is discharged to the outside, thus suppressing the void from being generated in the overlapped wafer $W_T$.

Figure 26:
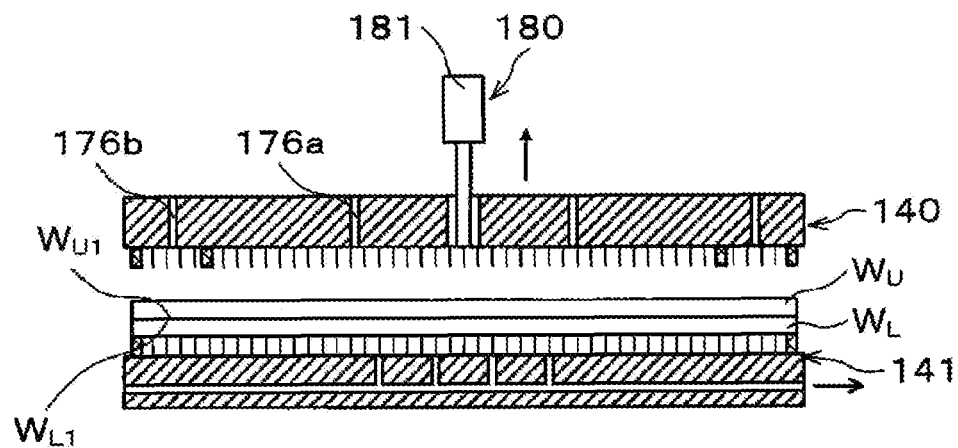
FIG. 26 is an explanatory view showing the upper wafer bonded to the lower wafer.

Thereafter, as shown in FIG. 26, the actuator part 181 of the pressing member 180 is moved upward to the upper chuck 140. Furthermore, the operation of the vacuum pump 196 is stopped such that the vacuum-drawing of the lower wafer $W_L$ in the suction region 193 is stopped. Thus, the adsorptive holding of the lower wafer $W_L$ by the lower chuck 141 is stopped. At this time, since the rear surface $W_{L2}$ of the lower wafer $W_L$ is supported by the pins 191, the lower wafer $W_L$ is easily detached from the lower chuck 141 when the vacuum-drawing of the lower wafer $W_L$ by the lower chuck 141 is released.

The overlapped wafer $W_T$, obtained by bonding the upper wafer $W_U$ and the lower wafer $W_L$, is transferred to the transition device 51 by the wafer transfer device 61 and is then transferred to the cassette $C_T$ existing on a respective one of the cassette mounting boards 11 by the wafer transfer device 22 of the carry-in/carry-out station 2. Thus, a series of bonding processes of the upper and lower wafers $W_U$ and $W_L$ is finished.

According to the aforementioned embodiment, in the lower chuck 141, the contact area of the support portion 192 with the lower wafer $W_L$ is made as small as possible insofar as the lower chuck 141 can support the outer peripheral portion of the lower wafer $W_L$ when vacuum—drawing the outer peripheral portion of the lower wafer $W_L$. This prevents particles from existing on the upper surface of the support portion 192, which makes it possible to suppress the vertical distortion of the lower wafer $W_L$.

The lower chuck 141 vacuum-draws the entire surface of the lower wafer $W_L$. That is to say, the lower chuck 141 appropriately vacuum-draws the lower wafer $W_L$ even up to the outer peripheral portion thereof, thus making the lower wafer $W_L$ flat. Moreover, the entire surface of the upper wafer $W_U$ is adsorptively held by the upper chuck 140, whereby the upper wafer $W_U$ is made flat even up to the outer peripheral portion thereof. This allows the air existing between the wafers $W_U$ and $W_L$ to be expelled to the outside, thus suppressing the void from being generated in the overlapped wafer $W_T$.

As described above, according to this embodiment, the process of bonding the wafers WU and WL together can be suitably performed by suppressing the vertical distortion of the overlapped wafer $W_T$ and suppressing the generation of the void in the overlapped wafer $W_T$.

The bonding system 1 according to this embodiment includes, in addition to the bonding device 41, the surface modifying device 30 configured to modify the front surfaces $W_{U1}$ and $W_{L1}$ of the wafers $W_U$ and $W_L$ and the surface hydrophilizing device 40 configured to hydrophilize and wash the front surfaces $W_{U1}$ and $W_{L1}$. Thus, the bonding of the wafers $W_U$ and the $W_L$ can be efficiently performed within a single system. This increases the throughput of the wafer bonding process.

Next, description will be made on modified examples of the lower chuck 141 of the bonding device 41 according to the aforementioned embodiment.

Figure 27:
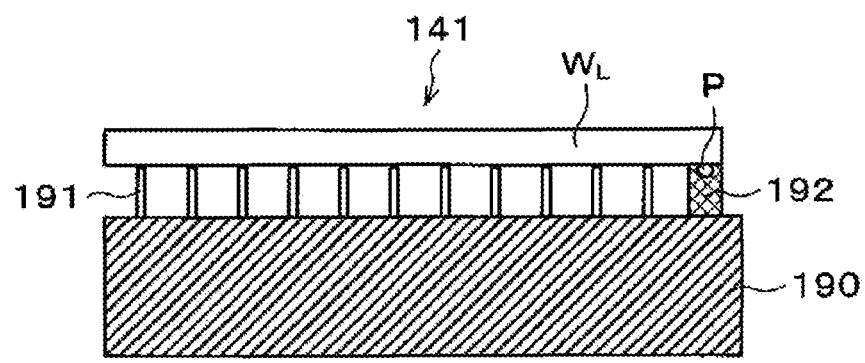
FIG. 27 is an enlarged explanatory view of an outer peripheral portion of a lower chuck in a modified example.

As shown in FIG. 27, the support portion 192 of the lower chuck 141 may have elasticity. For example, the support portion 192 may be formed of a material (e.g., silicon sponge or PTFE rubber) having a hardness of 20 degrees or less. In this case, even if a particle P exists on the support portion 192, the support portion 192 is deformed when the lower chuck 141 vacuum-draws the lower wafer $W_L$ so that the particle P is buried within the support portion 192. This makes the outer peripheral portion of the lower wafer $W_L$ flat, thus suppressing the vertical distortion of the lower wafer $W_L$.

Figure 28:
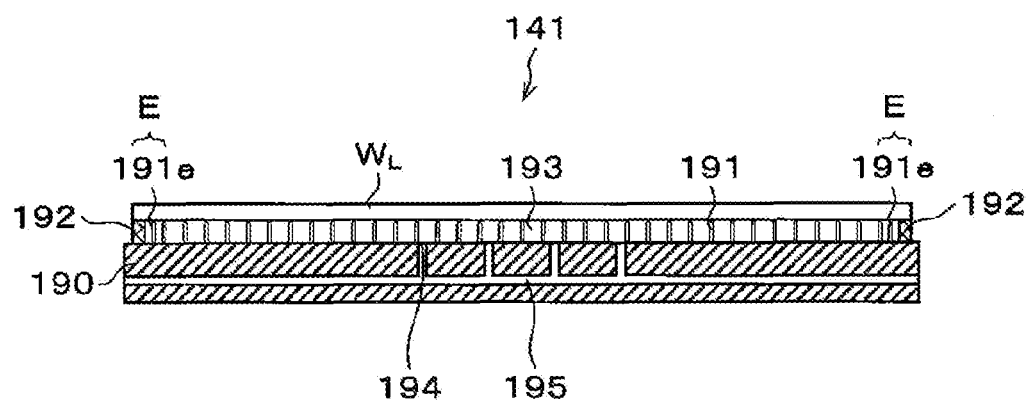
FIG. 28 is a vertical sectional view schematically showing a configuration of a lower chuck in another modified example.
Figure 29:
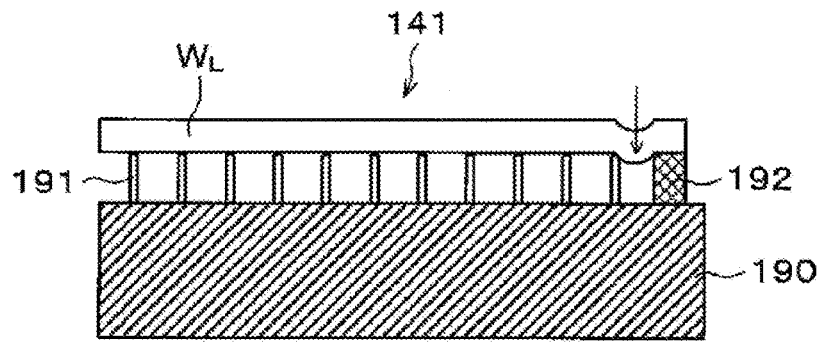
FIG. 29 is an enlarged explanatory view of an outer peripheral portion of a lower chuck in a comparative example.
Figure 30:
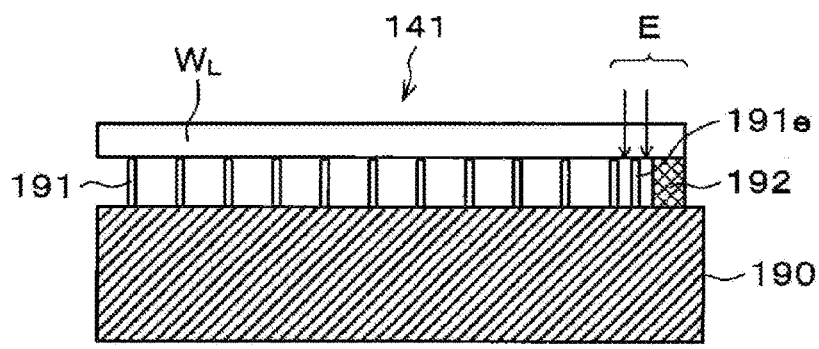
FIG. 30 is an enlarged explanatory view of an outer peripheral portion of a lower chuck in another modified example.

As shown in FIG. 28, pins 191e which are installed in an outer periphery region E adjoining the support portion 192 on the body portion 190 of the lower chuck 141, may be installed to be smaller than the interval of the pins 191 installed at the inner side of the outer periphery region E. As an example, the interval of the pins 191 is 1 mm but the interval of the pins 191e is 0.75 mm. For example, if the interval between the support portion 192 and the pins 191 adjoining the support portion 192 is large as shown in FIG. 29, when the lower chuck 141 vacuum-draws the outer peripheral portion of the lower wafer $W_L$, the outer peripheral portion of the lower wafer $W_L$ may be distorted vertically downward. Accordingly, if the interval of the pins 191e in the outer periphery region E is made small as shown in FIG. 30, it is possible to suppress the vertical distortion of the outer peripheral portion of the lower wafer $W_L$, thus making the outer peripheral portion of the lower wafer $W_L$ flat.

Figure 31:
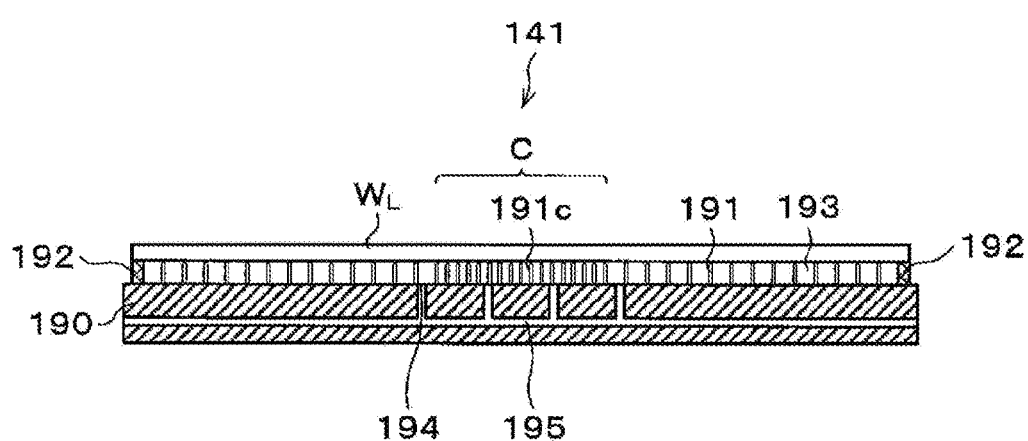
FIG. 31 is a vertical sectional view schematically showing a configuration of a lower chuck in another modified example.
Figure 32:
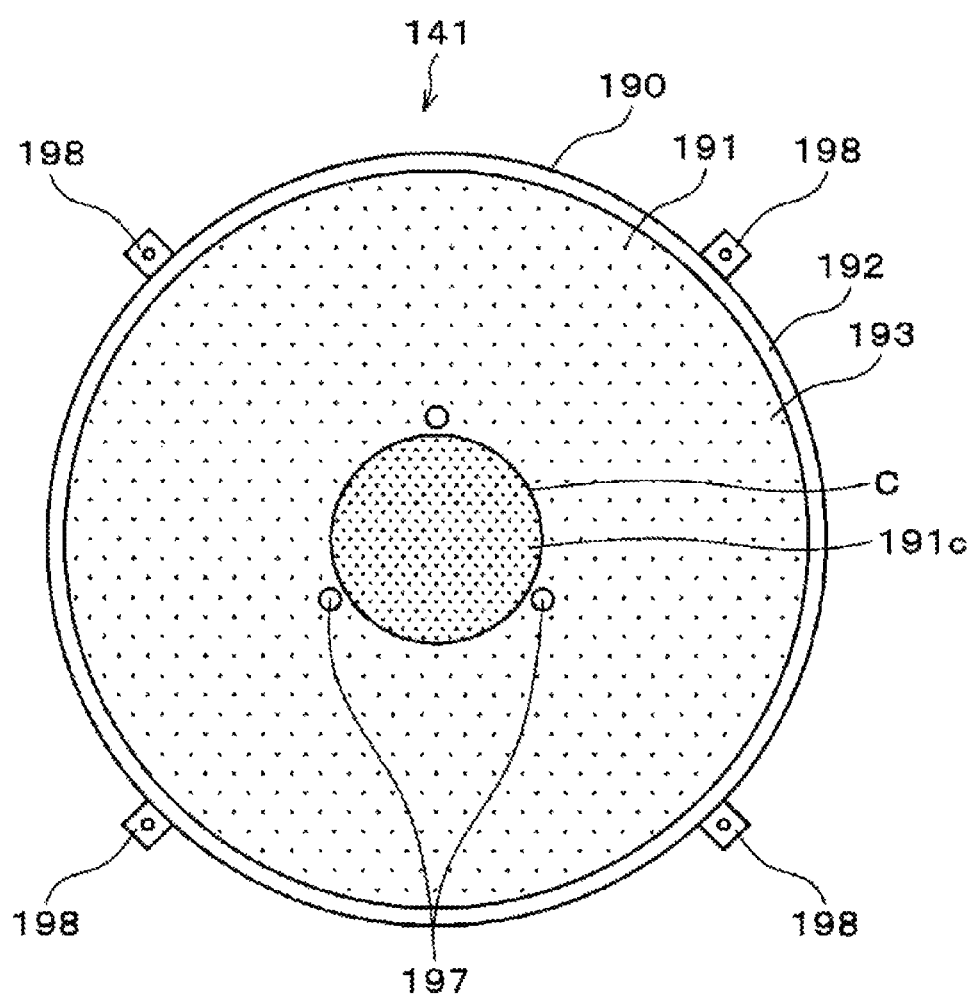
FIG. 32 is a plan view of a lower chuck in another modified example.
Figure 33:
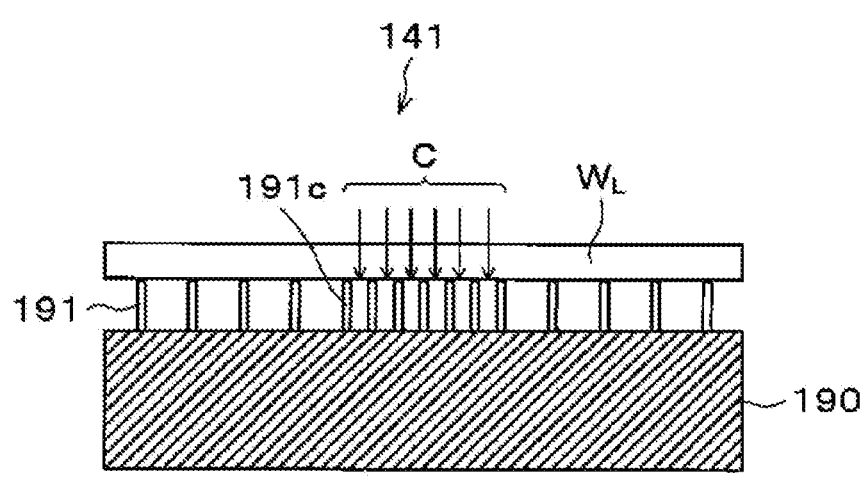
FIG. 33 is an enlarged explanatory view of a central portion of a lower chuck in another modified example.

In one modified example, as shown in FIGS. 31 and 32, the interval of the pins 191c installed in the central region (hereinafter referred to as a "central region C") of the body portion 190 of the lower chuck 141 may be smaller than the interval of the pins 191 installed at the outer side of the central region C. As an example, the interval of the pins 191 is 1.4 mm but the interval of the pins 191c is 0.75 mm. As described above, in the Step S12 of bonding the wafers $W_U$ and $W_L$, the central portion of the upper wafer $W_U$ and the central portion of the lower wafer $W_L$ are pressed against each other by the pressing member 180. In this case, the central portion of the lower wafer $W_L$ may be distorted vertically downward by the pressing load. To address this, the interval of the pins 191c in the central region C is made small as shown in FIG. 33 so that the vertical distortion of the central portion of the lower wafer $W_L$ is suppressed, thus making the lower wafer $W_L$ flat.

Figure 34:
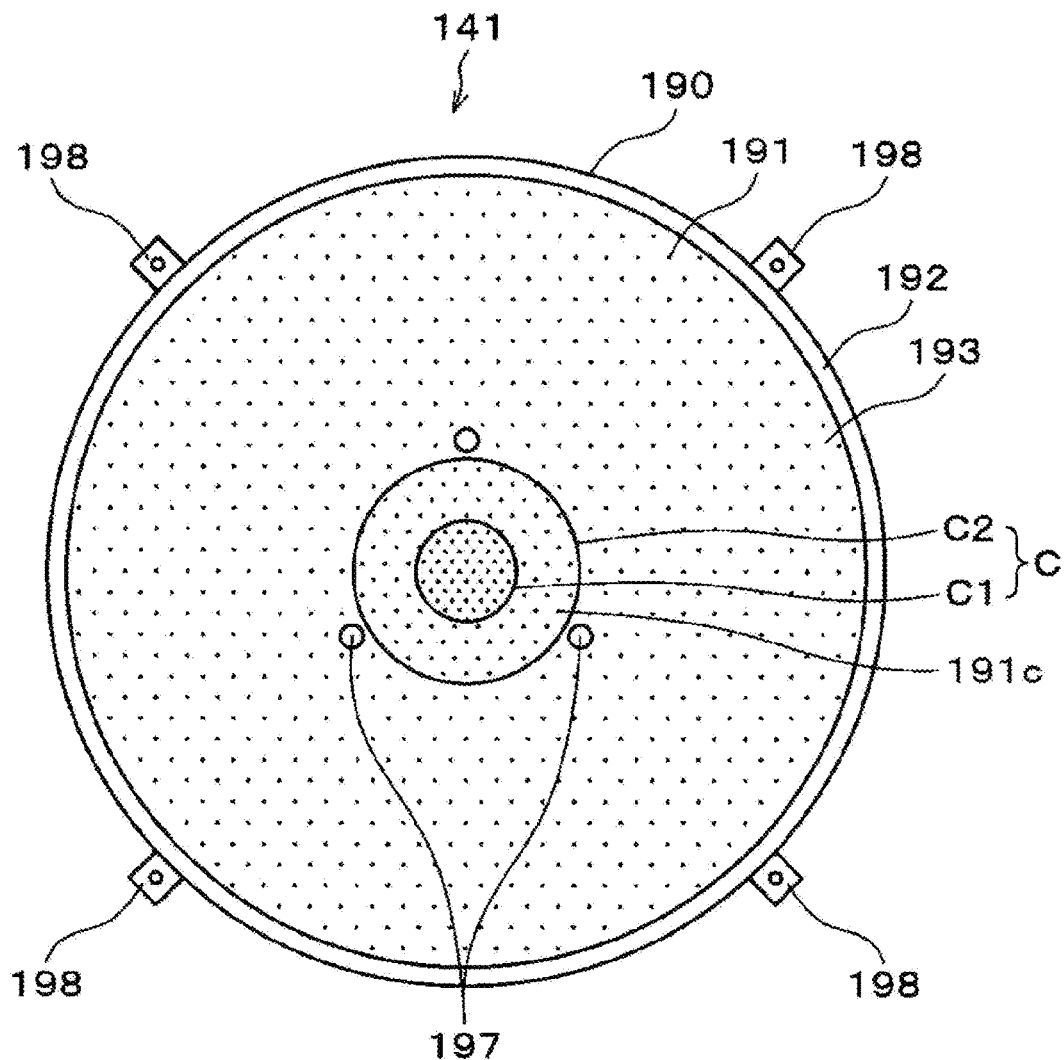
FIG. 34 is a plan view of a lower chuck in another modified example.

In another modified examples, as shown in FIG. 34, the central region C may be divided into a plurality of regions and the interval of the pins 191c may be changed in each of the divided regions. As an example, the central region C is divided into, e.g., a first central region C1 having a circular shape and a second central region C2 annularly formed at the outer side of the first central region C1 in a concentric relationship with the first central region C1. The interval of the pins 191c in the first central region C1 is smaller than the interval of the pins 191c in the second central region C2. The interval of the pins 191c in the second central region C2 is smaller than the interval of the pins 191 at the outer side of the central region C. By increasing the interval of the pins 191c (the pins 191) step by step from the inner region toward the outer region in this way, the contact area of the lower wafer $W_L$ supported by the lower chuck 141 can be smoothly changed, thus making the lower wafer $W_L$ flat. The number of the divided regions of the central region C is not limited to this embodiment but may be arbitrarily set. The effects mentioned above can be made remarkable as the number of the divided regions increases.

Figure 35:
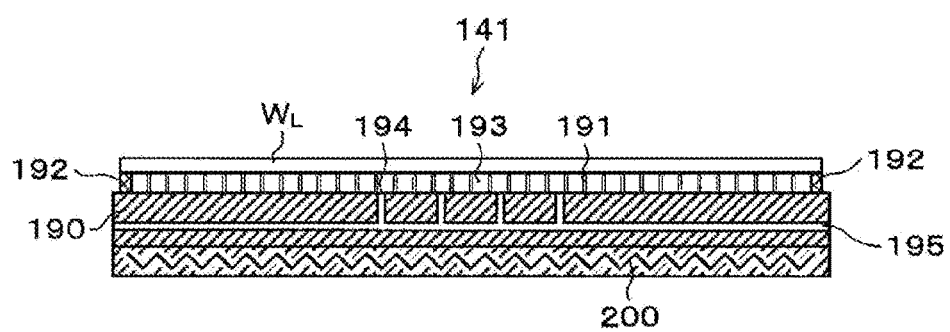
FIG. 35 is a vertical sectional view schematically showing a configuration of a lower chuck in another modified example.

In another modified example, as shown in FIG. 35, the lower chuck 141 may include a temperature control mechanism 200 configured to control the temperature of the lower wafer $W_L$ held by the lower chuck 141. For example, the temperature control mechanism 200 is installed within the body portion 190. For example, a heater is used as the temperature control mechanism 200. With this configuration, the lower wafer $W_L$ is heated to a predetermined temperature by the temperature control mechanism 200 so that the air existing between the wafers $W_U$ and $W_L$ is removed when performing Step S13 described above, which makes it possible to reliably suppress generation of the void in the overlapped wafer $W_T$.

In the lower chuck 141, surfaces of the tip portions of the pins 191 may be subjected to a roughing process. That is to say, the surfaces of the pins 191 that make contact with the rear surface $W_{L2}$ of the lower wafer $W_L$ may be subjected to the roughing process. With this configuration, even if particles adhere to the rear surface $W_{L2}$ of the lower wafer $W_L$, the particles do not adhere to the surfaces of the pins 191 subjected to the roughing process. Therefore, when a subsequent lower wafer $W_L$ is subjected to a bonding process, the particles do not affect the bonding process. It is therefore possible to appropriately perform the bonding process. The surface roughness of the pins 191 may be set arbitrarily. As an example, when the arithmetic average roughness Ra is set at 0.01 to 0.1, it is found that the aforementioned effects are manifested.

While in the above examples, the lower chuck 141 has been described to include the annular support portion 192 for supporting the outer edge portion of the lower wafer $W_L$ to vacuum-draw the lower wafer $W_L$ up to the outer peripheral portion thereof (hereinafter, such a configuration will be sometimes referred to as a "ring seal"). However, the configuration for vacuum-drawing the outer peripheral portion of the lower wafer $W_L$ is not limited thereto.

Figure 36:
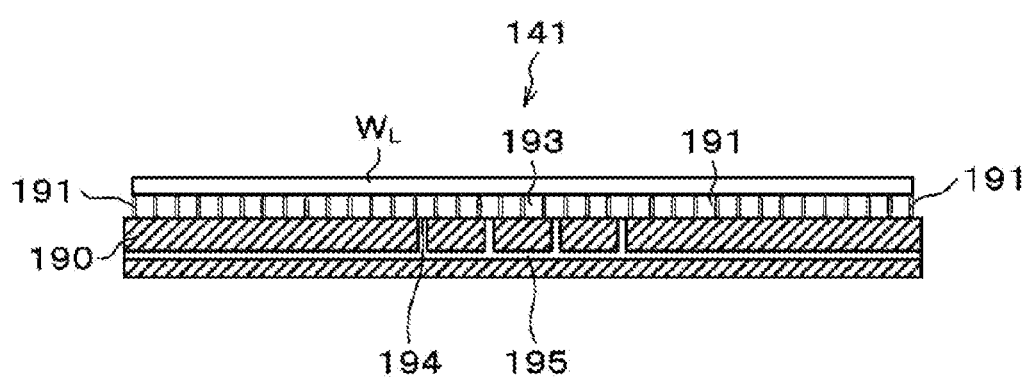
FIG. 36 is a vertical sectional view schematically showing a configuration of a lower chuck in another modified example.

In another modified example, as shown in FIG. 36, the lower wafer $W_L$ may be vacuum-drawn up to the outer peripheral portion thereof using a so-called static pressure seal. More specifically, the pins 191 on the body portion 190 are installed up to the outer peripheral portion of the lower wafer $W_L$. By regulating the suction pressure generated by the vacuum pump 196, the lower wafer $W_L$ is vacuum-drawn up to the outer peripheral portion thereof. In this embodiment, the pins 191 installed in the position corresponding to the outer peripheral portion of the lower wafer $W_L$ constitute a support portion (additional pins) according to the present disclosure. This further decreases the contact area of the support portion (the pins 191) with the outer peripheral portion of the lower wafer $W_L$. Accordingly, it is possible to prevent particles from existing on the support portion, thus reliably suppressing the vertical distortion of the lower wafer $W_L$.

Figure 37:
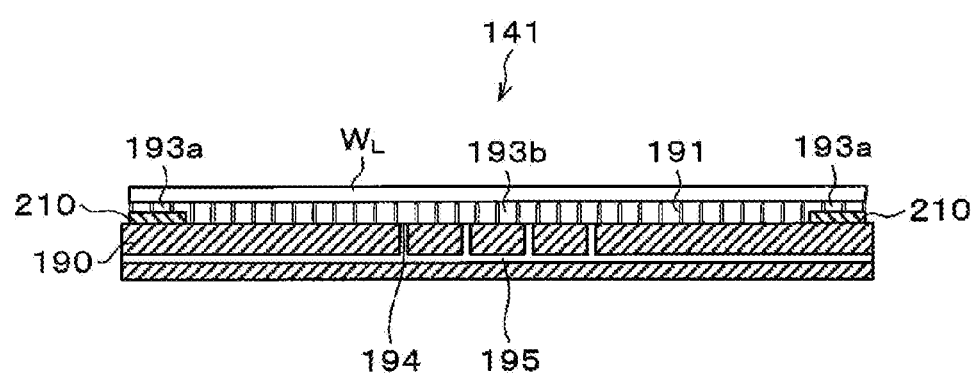
FIG. 37 is a vertical sectional view schematically showing a configuration of a lower chuck in another modified example.

In another modified example, as shown in FIG. 37, the lower chuck 141 may include a protrusion portion 210. The protrusion portion 210 is annularly installed on the body portion 190 in the position corresponding to the outer peripheral portion of the lower wafer $W_L$. The protrusion portion 210 is installed at a height lower than the pins 191. The pins 191 installed in the position corresponding to the outer peripheral portion of the lower wafer $W_L$ are arranged on the protrusion portion 210.

In this example, the position of the outer edge portion of the protrusion portion 210 coincides with the position of the outer edge portion of the lower wafer $W_L$. Alternatively, the protrusion portion 210 may be installed so as to extend outward beyond the outer edge portion of the lower wafer $W_L$. The position of the inner edge portion of the protrusion portion 210 is not particularly limited.

In this case, when the lower chuck 141 vacuum-draws the lower wafer $W_L$, a flow rate in a first suction region 193a where the protrusion portion 210 is set to be higher than that in a second suction region 193b where the protrusion portion 210 is not installed. This makes it possible to vacuum-draw the outer peripheral portion of the lower wafer $W_L$ with a force stronger than a force applied to the central portion of the lower wafer $W_L$, thus reducing the suction pressure generated by the vacuum pump 196. As a result, it is possible to efficiently perform the bonding process of the wafers $W_U$ and $W_L$.

Even when the lower chuck 141 employs the static pressure seal system as in the above embodiment, just like the ring seal system shown in FIGS. 31 to 34, the interval of the pins 191c installed in the central region C may be made smaller than the interval of the pins 191 installed at the outer side of the central region C. Furthermore, as shown in FIG. 35, the temperature control mechanism 200 may be installed in the lower chuck 141. Moreover, the surfaces of the tip portions of the pin 191 may be subjected to the roughening process.

While the modified examples of the lower chuck 141 have been described with reference to FIGS. 27 to 37, these modified examples may be applied to the upper chuck 140.

While in the bonding device 41 of the above embodiment, the upper chuck 140 has been described to be fixed to the processing vessel 100 and the lower chuck 141 has been described to be moved in the horizontal direction and the vertical direction, the present disclosure is not limited thereto. In some embodiments, the upper chuck 140 may be moved in the horizontal direction and the vertical direction and the lower chuck 141 may be fixed to the processing vessel 100. However, if the upper chuck 140 is moved, the moving mechanism becomes larger in size. It is therefore preferred in some embodiments to fix the upper chuck 140 to the processing vessel 100 as in the aforementioned embodiment.

In some embodiments, in the bonding system 1 configured as above, after the wafers $W_U$ and $W_L$ are bonded by the bonding device 41, the overlapped wafer $W_T$ thus obtained may be heated (annealed) to a predetermined temperature. The heating of the overlapped wafer $W_T$ allows the bonding interface to be strongly joined.

While certain preferred embodiments of the present disclosure have been described with reference to the accompanying drawings, the present disclosure is not limited to these embodiments. It will be apparent to those skilled in the art that different modifications and changes can be conceived without departing from the scope of the idea recited in the claims. It is to be understood that these modifications and changes may well belong to the technical scope of the present disclosure. The present disclosure is not limited to these examples and may employ many different forms. The present disclosure may be applied to a case where the substrate is not a wafer but is another substrate such as a FPD (Flat Panel Display), a mask reticle for a photo mask or the like.

According to the present disclosure, a contact area of a support portion with an outer peripheral portion of a second substrate is set as small as possible insofar as the support portion can support the outer peripheral portion of the second substrate when a second holding unit vacuum-draws the outer peripheral portion of the second substrate. Therefore, it is possible to prevent particles from existing on the outer peripheral portion of the second substrate, thus suppressing a vertical distortion of an overlapped substrate.

Further, according to the present disclosure, it is possible to reduce flatness of a surface of the second substrate by making heights of a plurality of pins installed in the second holding unit uniform. Furthermore, the second holding unit vacuum-draws the entire surface of the second substrate. That is to say, the second holding unit appropriately vacuum-draws the second substrate supported by the support portion even up to the outer peripheral portion thereof, thus making up to the outer peripheral portion of the second substrate flat. Therefore, when the substrates are brought into contact with each other in the bonding process, it is possible to expel air existing between the substrates to the outside, thus suppressing a void from being generated in the overlapped substrate.

According to the present disclosure in some embodiments, it is possible to appropriately hold substrates when the substrates are bonded together. This makes it possible to suitably perform the bonding process of the substrates while suppressing the vertical distortion of the overlapped substrate and suppressing generation of the void in the overlapped substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A device of bonding substrates together, comprising:
a first holding unit configured to vacuum-draw a first substrate and to adsorptively hold the first substrate on a lower surface thereof; and
a second holding unit installed below the first holding unit and configured to vacuum-draw a second substrate and to adsorptively hold the second substrate on an upper surface thereof,
wherein the second holding unit includes:
a body portion configured to vacuum-draw the entire surface of the second substrate;
a plurality of pins installed on the body portion and configured to make contact with a rear surface of the second substrate; and
an annular support portion installed on the body portion at the outer side of the pins, the annular support portion having a reduced contact area over which the annular support portion makes contact with an outer peripheral portion of the second substrate so as to support an outer peripheral portion of the rear surface of the second substrate when the second holding unit vacuum-draws the outer peripheral portion of the second substrate,
wherein the annular support portion is configured to support at least an outer edge portion of the rear surface of the second substrate,
wherein the annular support portion has elasticity, and
wherein an interval of the pins installed in a central portion of the body portion is smaller than an interval of the pins installed at the outer side of the central portion.

2. The device of claim 1, wherein an interval of the pins installed in a region adjoining the annular support portion is smaller than an interval of the pins installed at an inner side of the region.

3. The device of claim 1, wherein the annular support portion includes a plurality of additional pins which makes contact with the outer peripheral portion of the rear surface of the second substrate.

4. The device of claim 3, wherein the second holding unit includes a protrusion portion annularly installed on the body portion in a position corresponding to the outer peripheral portion of the second substrate, the protrusion portion having a height lower than the pins, and
the additional pins are installed on the protrusion portion.

5. The device of claim 1, wherein the central portion of the body portion is concentrically divided into a plurality of regions, and the interval of the pins becomes larger from an inner region toward an outer region in the central portion of the body portion.

6. The device of claim 1, wherein the pins have surfaces subjected to a roughening process.

7. The device of claim 1, wherein the second holding unit further includes a temperature control mechanism configured to control a temperature of the second substrate held by the second holding unit.

8. The device of claim 1, wherein the first holding unit includes:
   an additional body portion configured to vacuum-draw the entire surface of the first substrate;
   a plurality of additional pins installed on the additional body portion and configured to make contact with a rear surface of the first substrate; and
   an additional support portion annularly installed on the additional body portion at the outer side of the additional pins and configured to support at least an outer edge portion of the rear surface of the first substrate.

9. A bonding system provided with the bonding device of claim 1, comprising:
   a processing station including the bonding device; and
   a carry-in/carry-out station capable of holding a plurality of first substrates, a plurality of second substrates or a plurality of overlapped substrates each of which obtained by bonding the first substrate and the second substrate and configured to carry the first substrate, the second substrate or the overlapped substrate into and out of the processing station,
   wherein the processing station includes:
   a surface modifying device configured to modify a front surface of the first substrate or the second substrate to be bonded;
   a surface hydrophilizing device configured to hydrophilize the front surface of the first substrate or the second substrate modified in the surface modifying device; and
   a transfer device configured to transfer the first substrate, the second substrate or the overlapped surface between the surface modifying device, the surface hydrophilizing device and the bonding device,
   wherein the bonding device is configured to bond the first substrate and the second substrate whose front surfaces are hydrophilized by the surface hydrophilizing device.

* * * * *